United States Patent [19]
Kuroyanagi et al.

[11] Patent Number: 5,250,449
[45] Date of Patent: Oct. 5, 1993

[54] VERTICAL TYPE SEMICONDUCTOR DEVICE AND METHOD FOR PRODUCING THE SAME

[75] Inventors: Akira Kuroyanagi, Okazaki; Masami Yamaoka; Yoshifumi Okabe, both of Anjo, all of Japan

[73] Assignee: Nippondenso Co., Ltd., Kariya, Japan

[21] Appl. No.: 767,313

[22] Filed: Sep. 30, 1991

[30] Foreign Application Priority Data

Oct. 1, 1990 [JP] Japan ................... 2-264701

[51] Int. Cl.$^5$ .......................... H01L 21/265
[52] U.S. Cl. ....................... 437/40; 437/41; 437/27; 437/29; 437/235; 148/DIG. 126; 257/342; 257/339; 257/401
[58] Field of Search ........ 437/41, 27, 29, 40, 437/235; 357/23.3, 23.4, 27; 148/DIG. 126; 257/212

[56] References Cited

U.S. PATENT DOCUMENTS

| | | | |
|---|---|---|---|
| 4,672,407 | 6/1987 | Nakagawa et al. | 257/212 |
| 4,879,254 | 11/1989 | Tsuzuki et al. | 437/41 |
| 4,896,199 | 1/1990 | Tsuzuki et al. | 357/28 |
| 4,904,613 | 2/1990 | Coe et al. | 437/27 |
| 4,998,151 | 3/1991 | Korman et al. | 357/23.4 |
| 5,031,009 | 7/1991 | Fujihiri | 257/212 |

FOREIGN PATENT DOCUMENTS

| | | |
|---|---|---|
| 0255970 | 2/1988 | European Pat. Off. |
| 3-24737 | 2/1991 | Japan |
| 2193597 | 2/1988 | United Kingdom |
| 2199694 | 7/1988 | United Kingdom |

OTHER PUBLICATIONS

Modeling of the On-Resistance of LDMOS, and VMOS Power Transistors, pp. 356-367, S. C. Sun et al., IEEE Electron Devices, vol. 27, No. 2 (date unknown).

*Primary Examiner*—Robert Kunemund
*Assistant Examiner*—H. Jey Tsai
*Attorney, Agent, or Firm*—Cushman, Darby & Cushman

[57] ABSTRACT

The present invention has as an object the provision of a vertical type semiconductor device whereby miniaturization and lowered ON resistance of the cell can be achieved without impairing the functioning of the device.

The line width of the gate electrode is made smaller to meet the demand for miniaturization of the cell, but the distance between the channel regions diffused into the portions below the gate at the time of double diffusion is kept to be virtually equal to that in the device of larger cell size having a low $J_{FET}$ resistance component. Here, the reason for making the line width of the gate electrode smaller is for securing an area for the source contact.

The point is that, while the width of the gate electrode is set to be smaller, the mask members as the mask for double diffusion, having the width allowing the source region to diffuse to the portion under the gate, are attached to the side walls of the gate electrode.

Thereby, miniaturization and lowered ON resistance of the cell can be achieved without impairing the functioning of the device.

9 Claims, 22 Drawing Sheets

VERTICAL TYPE SEMICONDUCTOR DEVICE AND METHOD FOR PRODUCING THE SAME

BACKGROUND OF THE INVENTION

1. Field of the Invention

The present invention relates to a vertical type semiconductor device and a method for producing the same.

2. Description of Related Arts

Various technologies have so far been developed for lowering the ON resistance $R_{on}$, the resistance in the operating state, of a power MOS, especially of a vertical type DMOS (Double Diffused MOS) transistor. The ON resistance $R_{on}$ of a vertical type MOS transistor, as shown in FIG. 16, consists of the following components:

$$R_{on} = R_{cont} + R_s + R_{ch} + R_D + R_{JFET} + R_{epi} + R_{sub} + R_B. \quad (1)$$

where $R_{cont}$ represents the contact resistance, $R_s$ the source resistance, $R_{ch}$ the channel resistance, $R_D$ the depletion resistance, $R_{JFET}$ the JFET resistance, $R_{epi}$ the epitaxial layer resistance, $R_{sub}$ the substrate resistance, and $R_B$ the back side contact resistance.

The channel resistance $R_{ch}$ is given by the following expression (refer to "IEEE Transactions on Electron Devices", Vol. ED-27, No. 2, pp. 356-367, published in February, 1980).

$$R_{ch} = \frac{1}{(W/L_{eff})C_o \mu_E(V_G - V_{TE})}, \quad (2)$$

where W represents the channel width, $L_{eff}$ the effective channel length given by $K(X_{chpj} - X_{N+j})$ (where $X_{chpj}$ represents the diffusion depth of the P$^-$ channel region 41, $X_{N+j}$ the diffusion depth of the N$^+$ source region 42, and K a constant below unity, refer to FIG. 17), $C_o$ the gate capacity per unit area, $\mu_E$ the mobility, $V_{TE}$ the threshold voltage, and $V_G$ the gate voltage.

The depletion resistance $R_D$ is expressed as $$R_D = \frac{1}{3} \cdot \frac{1}{(W/L_{eff}')C_o \mu_D(V_G - V_{TD})}, \quad (3)$$

where $L_{eff}'$ represents the depletion mode effective channel length, $\mu_D$ the mobility of the accumulation layer, and $V_{TD}$ the depletion mode threshold voltage.

JFET resistance $R_{JFET}$ is expressed as $$R_{JFET} = \frac{\rho}{W} \left( \frac{1}{\sqrt{1 - \{2 X_{chpj}/(L_G + 0.3 X_{chpj})\}}} \times \tan^{-1}(0.414) \sqrt{\frac{L_G + 2.3 X_{chpj}}{L_G - 1.7 X_{chpj}}} - \frac{\pi}{8} \right) \quad (4)$$

where $L_G$ represents the line width of the polysilicon gate electrode member 43 (refer to FIG. 17) and $\rho$ represents the specific resistance of epitaxial layer.

Epitaxial layer resistance $R_{epi}$ is expressed as $$R_{epi} = \frac{\rho}{2W} \cdot \frac{1}{\tan\alpha} \ln\left(1 + 2 \cdot \frac{h}{a} \tan\alpha\right), \quad (5)$$

where $\alpha$, a, and h represent constants.

Reduction in the ON resistance $R_{on}$ is achieved, with respect to the channel resistance $R_{ch}$ for example, by decreasing the diffusion depth $X_{chpj}$ of the P$^-$ channel region 41 or by increasing the diffusion depth $X_{N+j}$ of the N$^+$ source region 42 to thereby decrease $L_{eff}$ shown in FIG. 17, according to the expression (2). As to the JFET resistance $R_{JFET}$ the JFET resistance $R_{JFET}$ can be reduced by increasing the line width $L_G$ of the polysilicon gate electrode 43 or by increasing the concentration of epitaxial layer (that means lowering the specific resistance $\rho$), according to the expression 4. Further, as to the epitaxial layer resistance $R_{epi}$, the epitaxial layer resistance $R_{epi}$ can be reduced by increasing the concentration of epitaxial layer (that means lowering the specific resistance $\rho$), according to the expression 5.

SUMMARY OF THE INVENTION

However, if the diffusion depth $X_{chpj}$ of the P$^-$ channel region 41 shown in FIG. 17 is decreased or the epi concentration is increased, then the source-drain breakdown or withstand voltage of the device is lowered, and if the diffusion depth $X_{N+j}$ of the N$^+$ source region 42 is increased, with the diffusion depth $X_{chpj}$ of the P$^-$ channel region 41 remaining unchanged, the withstand voltage, such as the punchthrough voltage, is lowered. Further, if the line width $L_G$ of the polysilicon gate electrode member 43 is increased, a problem arises that the degree of circuit integration is lowered. If the diffusion depth $X_{N+j}$ of the N$^+$ source region 42 is decreased to achieve miniaturization of the unit cell, the sheet resistance $R_s$ of the N$^+$ source region 42 is increased.

An object of the present invention is to achieve lowered ON resistance and miniaturization of the unit cell (higher degree of circuit integration) of a vertical type semiconductor device while keeping its performance unchanged.

A vertical type semiconductor device according to the present invention comprises an electrode member having a predetermined width disposed on a semiconductor substrate with an insulating film interposed therebetween, an insulating mask member having a predetermined width formed on each side of the electrode member, a first impurity region formed within the semiconductor substrate below the electrode member by introducing an impurity of a first conduction type with the electrode member and mask member used as the mask, and a second impurity region formed within the first impurity region, in the shallower position and in the narrower range than the same, below the electrode member by introducing an impurity of a second conduction type with the electrode member and mask member used as the mask.

Further, a method for producing a vertical type semiconductor device according to the present invention comprises a first step of forming an insulating film on a semiconductor substrate and forming an electrode member with a predetermined width on the insulating film, a second step of forming an insulating mask member with a predetermined width on each side of the electrode member, and a third step of forming a first impurity region within the semiconductor substrate below the electrode member by introducing an impurity of a first conduction type with the electrode member and mask member used as the mask and forming a second impurity region within the first impurity region, in the shallower position and in the narrower range than the same, below the electrode member by introducing an impurity of a second conduction type with the electrode member and mask member used as the mask.

Therefore, according to the present invention, the distance between adjoining edge portions of the first impurity regions under the electrode member is prolonged by the length masked by the mask members, with parameters such as diffusion depths of the first and second impurity regions remaining unchanged. In other words, the cell size can be reduced while the distance between the edge portions of the first impurity regions is kept constant.

Even if the cell size is reduced, the area of contact can be secured by the insulating mask member disposed on the side portion of the electrode being of a predetermined width.

Thus, according to the present invention, lowered ON resistance and miniaturization of the unit cell (higher degree of circuit integration) can be achieved while maintaining the performance of the device.

DESCRIPTION OF THE PREFERRED EMBODIMENTS

The present invention will be described below as related to embodiments shown in the accompanying drawings.

First Embodiment

A first embodiment of the present invention will now be described below with reference to the accompanying drawings.

Figure 1:
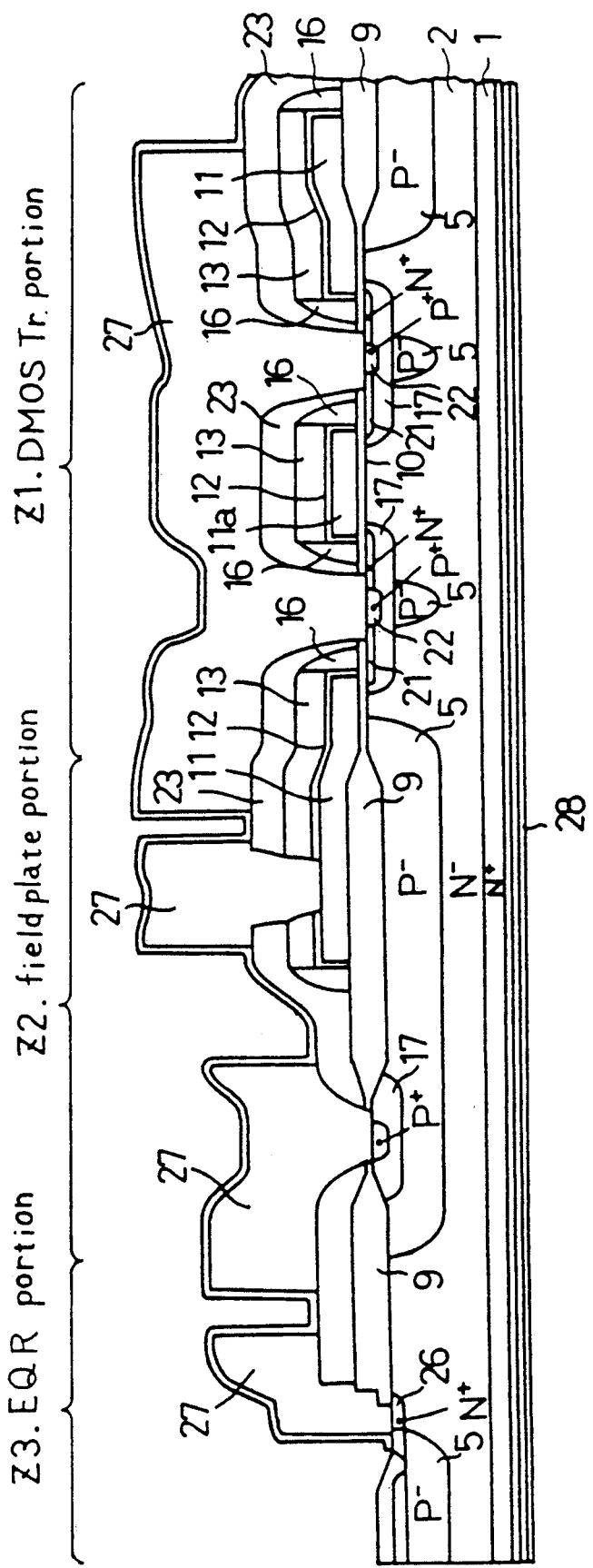
FIG. 1 is a sectional view of a semiconductor device according to a first embodiment.

A semiconductor device having an N-channel vertical type DMOS transistor portion Z1 is shown in FIG. 1, in which a field plate portion Z2 and a peripheral portion (equivalent ring; EQR portion) Z3 are shown in addition to the DMOS transistor portion Z1. FIGS. 2 to 15 show the production process of the device. Description will be given below according to the production process taking a case where the withstand voltage is set to around 60 V as an example.

Figure 2:
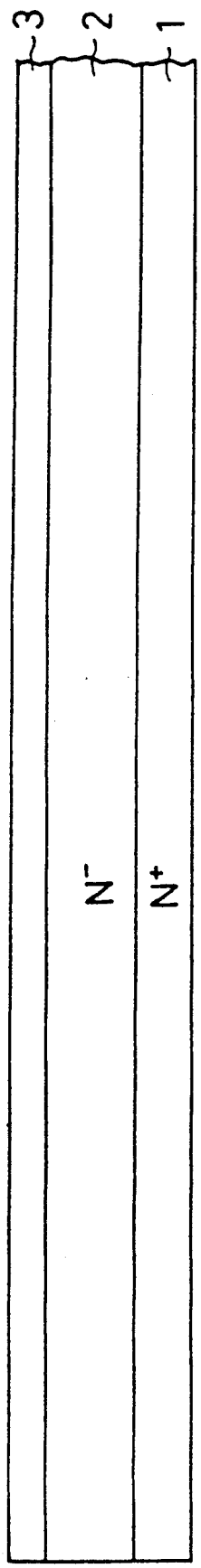
FIGS. 2 to 15 are diagrams showing the production process of the semiconductor device of the first embodiment.

As shown in FIG. 2, an N$^-$ silicon substrate 1 is prepared and, over the same, an N$^-$ epitaxial layer 2 is formed. Thereafter, a silicon oxide film 3 is formed to a thickness of around 3000 to 5000 Å over the N$^-$ epitaxial layer 2.

Figure 3:
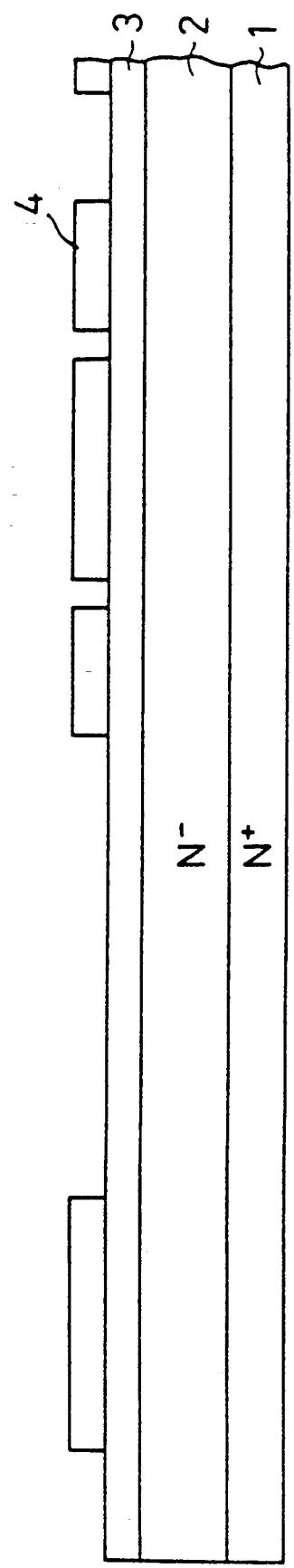
Figure 4:
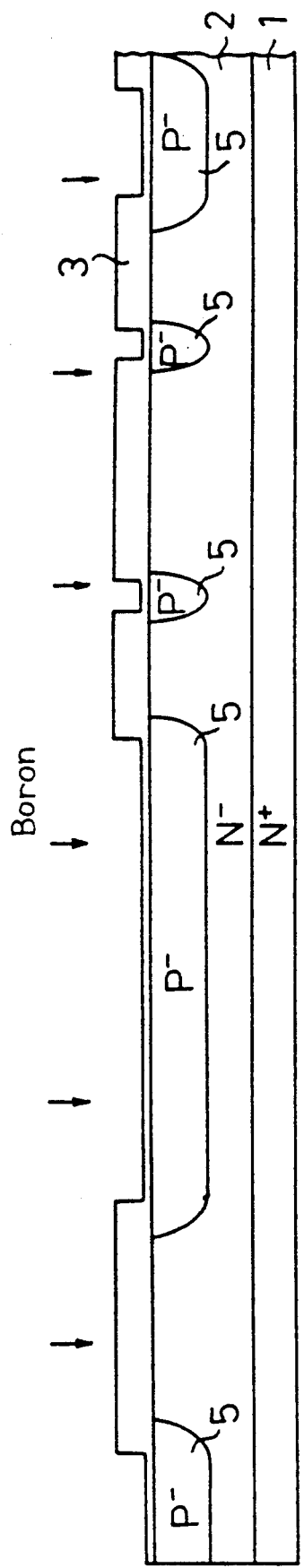

Then, as shown in FIG. 3, photo etching is applied to the silicon oxide film 3 using a resist 4 for forming a deep P$^-$ well layer. Thereafter, as shown in FIG. 4, boron ions are implanted under the condition of $3 \times 10^{13}$ cm$^{-2}$ dose at 60 keV and drive in (1170° C., 4-6 hours, N$_2$) is performed, whereby a deep P$^-$ well layer 5 is formed.

Figure 5:
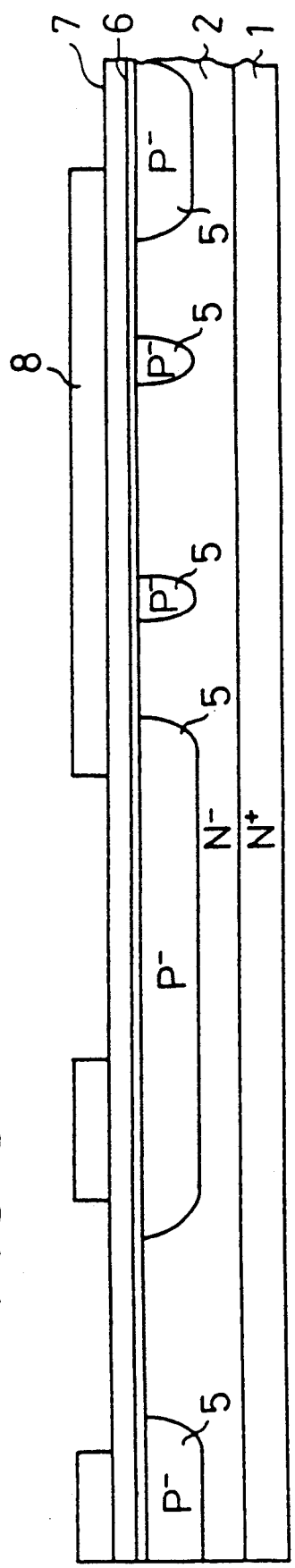
Figure 6:
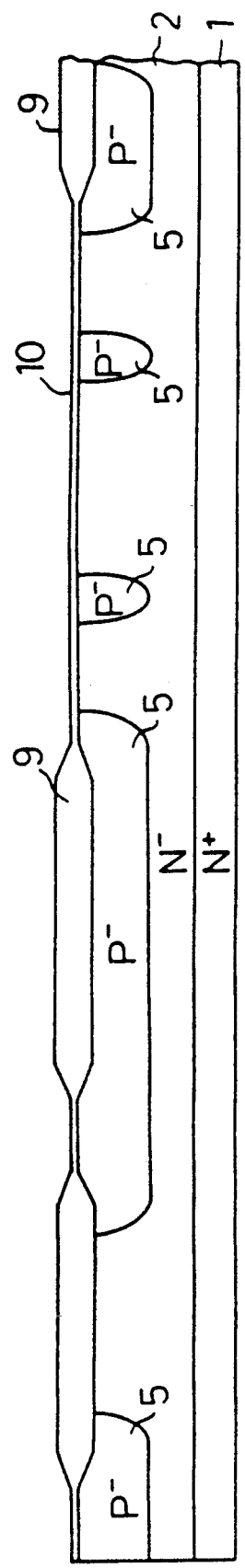

Then, as shown in FIG. 5, the silicon oxide film 3 is removed and a pad oxide film 6 is formed on the surface of the epitaxial layer 2 to a thickness of around 300 to 500 Å. Over the same, a silicon nitride film (Si$_3$N$_4$ film) is deposited to a thickness of around 1000 to 2000 Å and, thereafter, the silicon nitride film, 7 is subjected to patterning by photoetching with a resist 8 used. Then, as shown in FIG. 6, a field oxide film 9 is formed to a thickness of around 9000 to 10000 Å by LOCOS oxidation. Thereafter, the silicon nitride film 7 is removed with hot phosphoric acid and the pad oxide film 6 is removed by etching with HF or the like applied to the entire surface, and in succession, a gate oxide film 10 is formed to a thickness of around 300 to 1000 Å.

Figure 7:
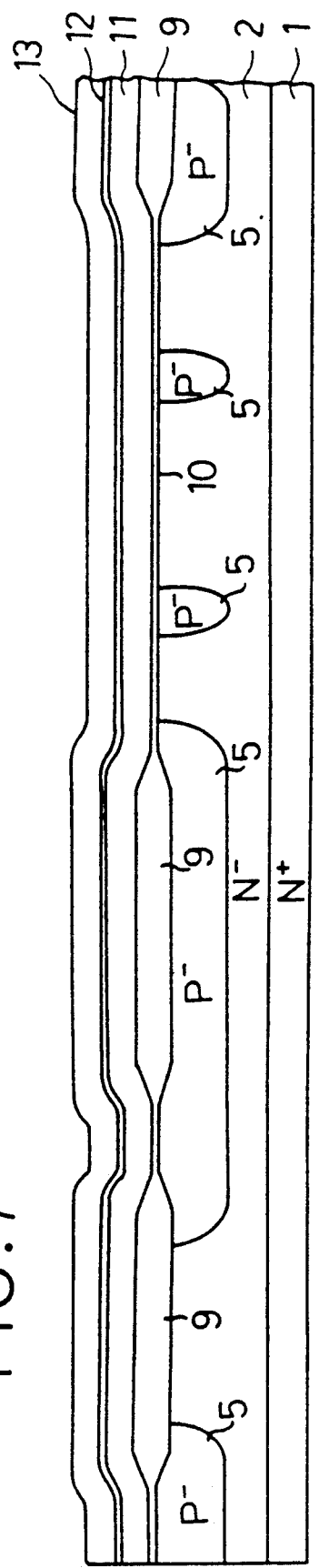

Then, as shown in FIG. 7, a polysilicon film 11 is deposited on the entire surface to a thickness of around 5000 to 10000 Å by LPCVD method and a phosphor diffusion treatment is applied to the film so that the polysilicon film 11 is turned into a phosphor doped polysilicon film 11. The surface of the phosphor doped polysilicon film 11 is then thermally oxidized so that a polysilicon oxide film 12 is formed to a thickness of around 500 to 1500 Å and over the same, a silicon oxide film 13 is formed by CVD to a thickness of around 1 μm.

Figure 8:
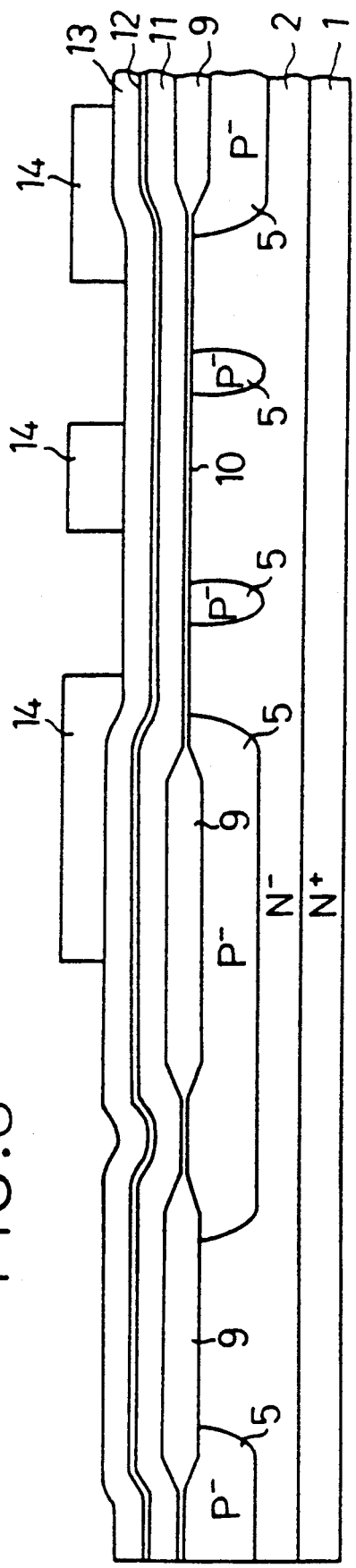
Figure 9:
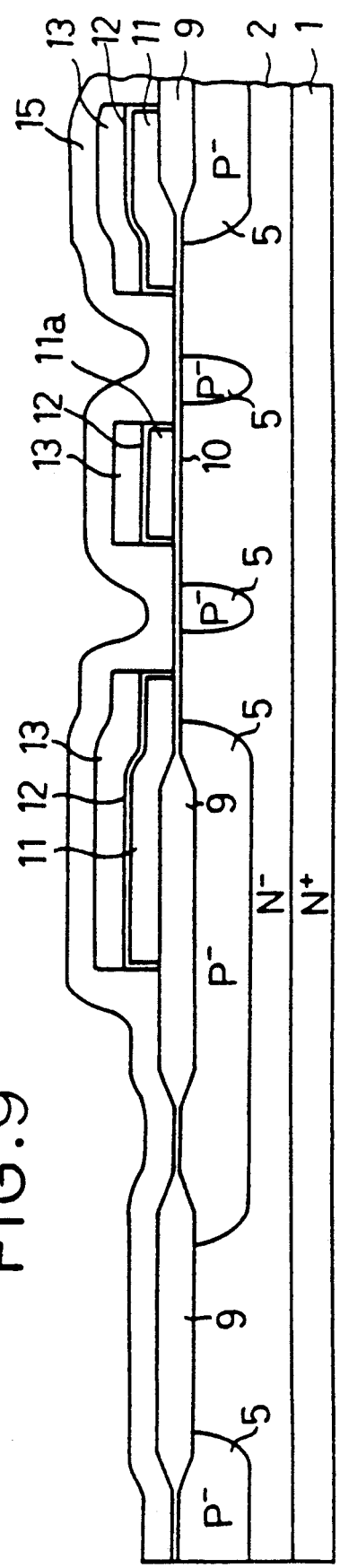

Then, as shown in FIG. 8, a patterning treatment is applied to the phosphor doped polysilicon film 11, polysilicon oxide film 12, and silicon oxide film 13 using a resist 14. As a result, as shown in FIG. 9, there is formed a phosphor doped polysilicon electrode member (hereinafter briefly called "polysilicon gate electrode member") 11a disposed in the region for forming the transistor on the epitaxial layer 2 with the gate oxide film 10 interposed therebetween. Further, in FIG. 9, the peripheral wall portion of the phosphor doped polysilicon electrode member 11a is thermally oxidized after the patterning and, thereby, a polysilicon oxide film is formed there.

Figure 10:
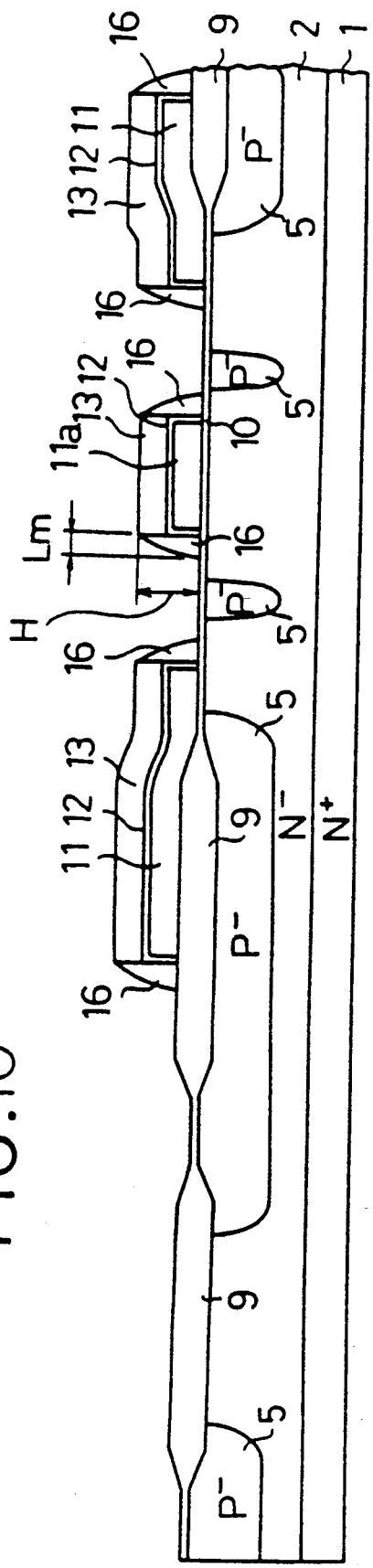

Thereafter, a CVD silicon oxide film 15 of TEOS having a good step covering characteristic is formed on the entire surface to a thickness of around 1 μm. Then, as shown in FIG. 10, the CVD silicon oxide film 15 is subjected to an etchback treatment by dry etching, and as a result, mask members 16 of the CVD silicon oxide film 15 are formed on the side portions of the phosphor doped polysilicon film 11 (including the polysilicon gate electrode member 11a).

The width L$_m$ of the mask member 16 at its bottom depends on the thickness H of the laminated film of the phosphor doped polysilicon film 11, polysilicon oxide film 12, and silicon oxide film 13. Further, the width L$_m$ of the mask member 16 is set to less than 0.85 time the depth of the N$^+$ source region 21 in FIG. 1. That is, as stated in "IEEE Transactions on Electron Devices", Vol. ED-27, No. 2, pp. 356-367, published in February, 1980, the lateral diffusion is set to 0.85 time the vertical diffusion, and setting the width $L_m$ to less than 0.85 time the depth of the N+ source region 21 provides the condition for forming the N+ source region 21 below the polysilicon electrode member 11a.

Figure 11:
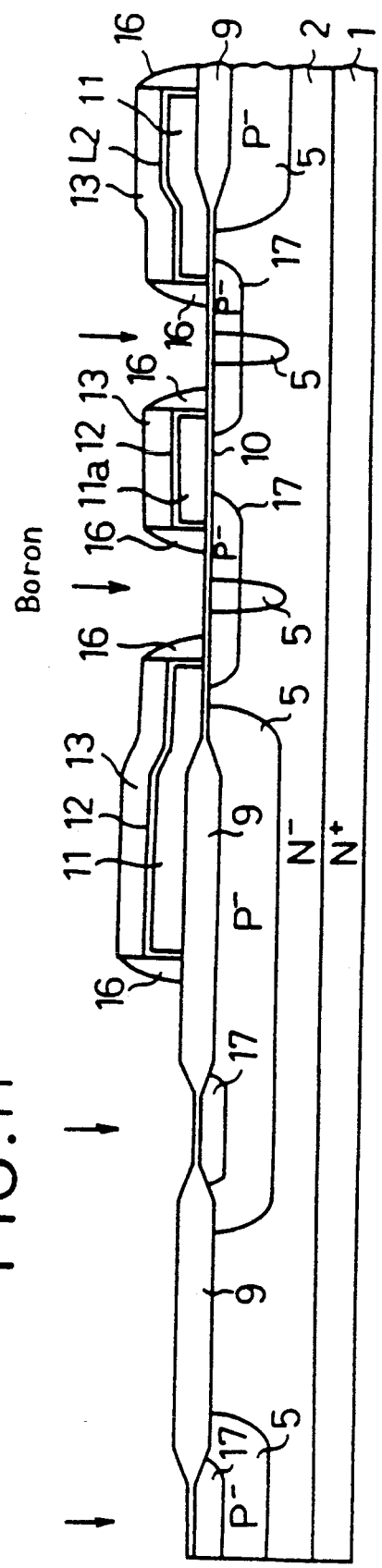
Figure 12:
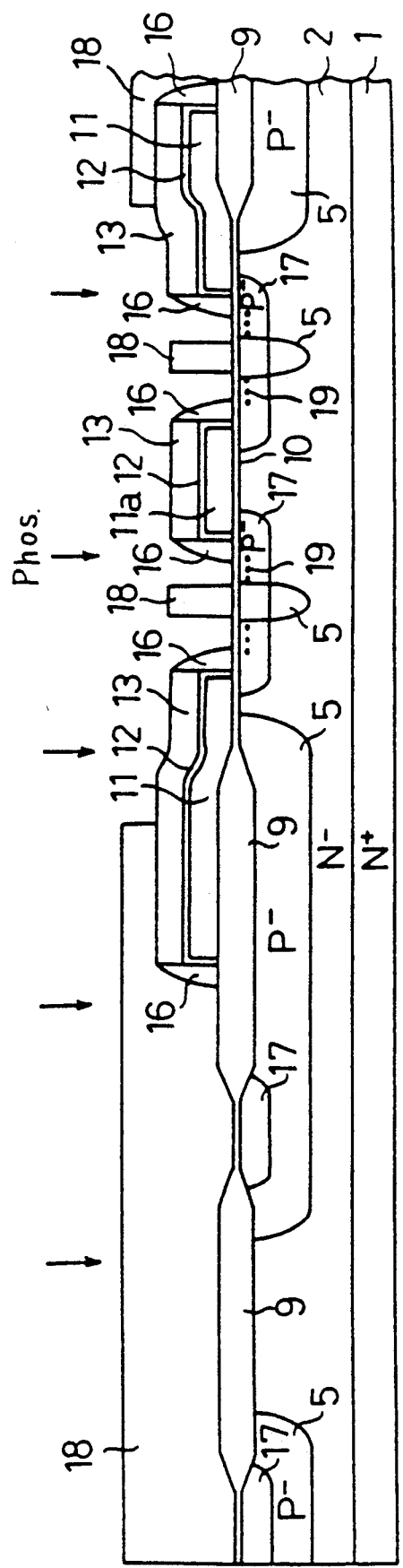

Then, as shown in FIG. 11, boron ions are implanted into the entire surface (maskless) under the condition of $6 \times 10^{13}$ to $9 \times 10^{13}$ cm$^{-2}$ dose at 40 keV, and further, drive in is performed at 1170° C. for about 60 minutes, whereby a P− channel region 17 is formed. Thereafter, as shown in FIG. 12, phosphor ions are implanted under the condition of $5 \times 10^{15}$ cm$^{-2}$ dose at 130 keV using a mask 18 patterned by photolithography, and thereby an N+ implanted region 19 is formed.

Figure 13:
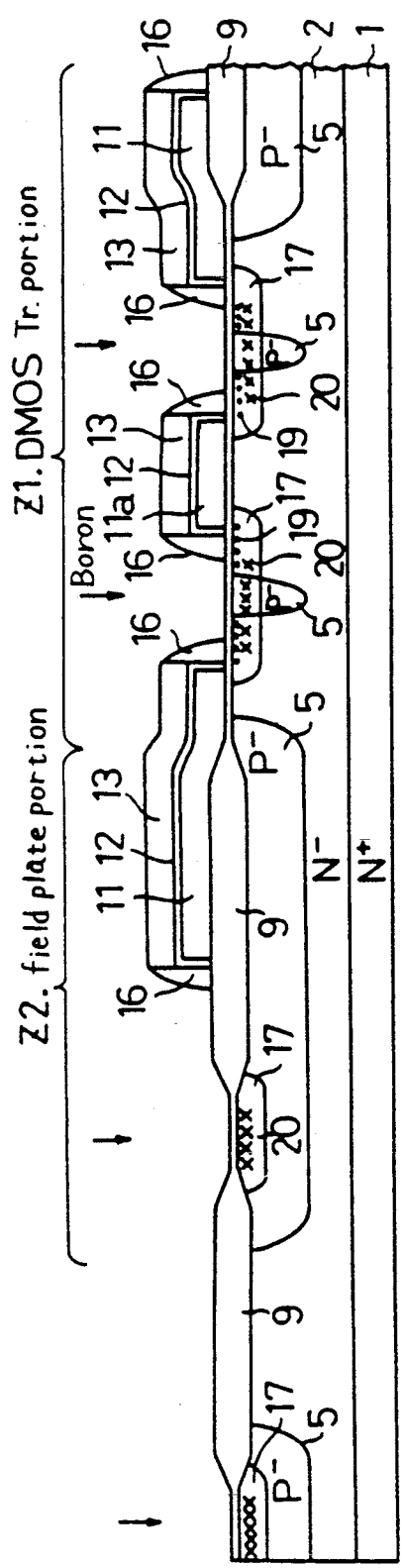

Then, as shown in FIG. 13, boron ions are implanted into the entire surface for forming a body contact with the P− channel region 17 in the DMOS transistor portion Z1 and a contact in the field plate portion Z2 under the condition of around $6 \times 10^{14}$ cm$^{-2}$ dose at 60 KeV, and thereby P+ implanted regions 20 are formed.

Figure 14:
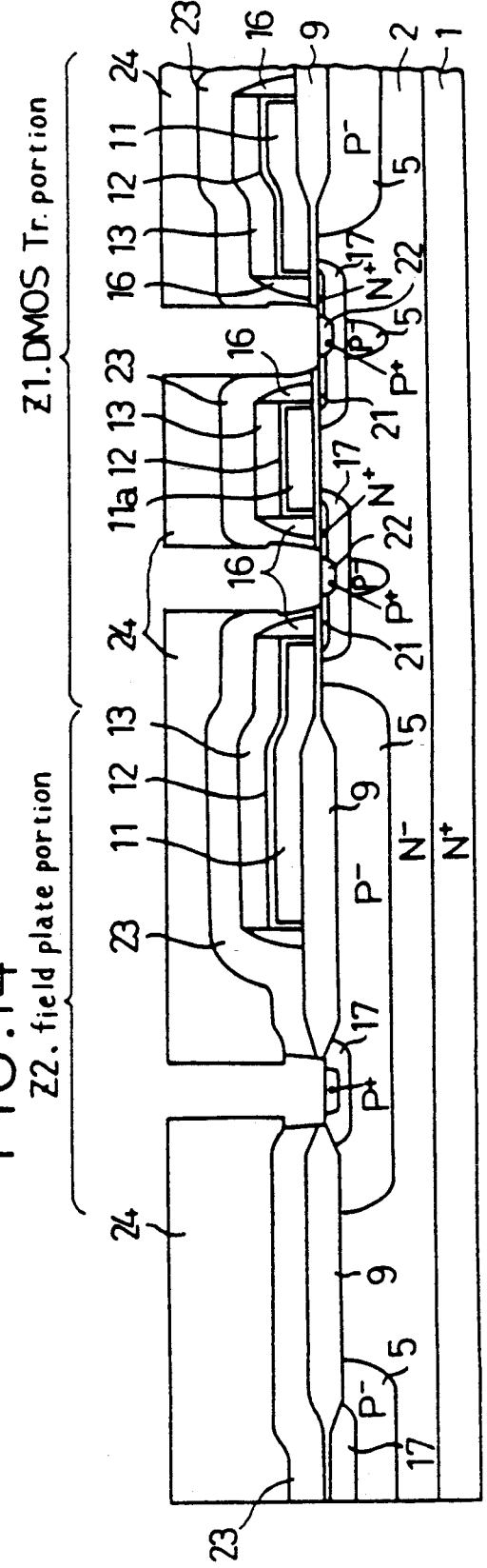

Then, as shown in FIG. 14, a heat treatment is performed in $N_2$ so that N+ source regions 21 and a P+ contact regions 22 are formed. At this time, if the heat treatment is performed at 1000° to 1050° C. for one hour, for example, the N+ source region 21 and P+ contact region 22 reach a depth of around 0.7 to 1.2 μm. Although the N+ source region 21 is also implanted with boron ions, phosphor is around 10 times as high in ion concentration as boron, and the boron of such concentration has little effect in the N+ source region 21.

Then, a BPSG film 23 is applied to the entire surface and specified portions of the BPSG film 23 are removed by photoetching (wet or dry etching) using a resist 24, whereby holes are made at the contact portion in the DMOS transistor portion Z1 and the contact portion in the field plate portion Z2.

Figure 15:
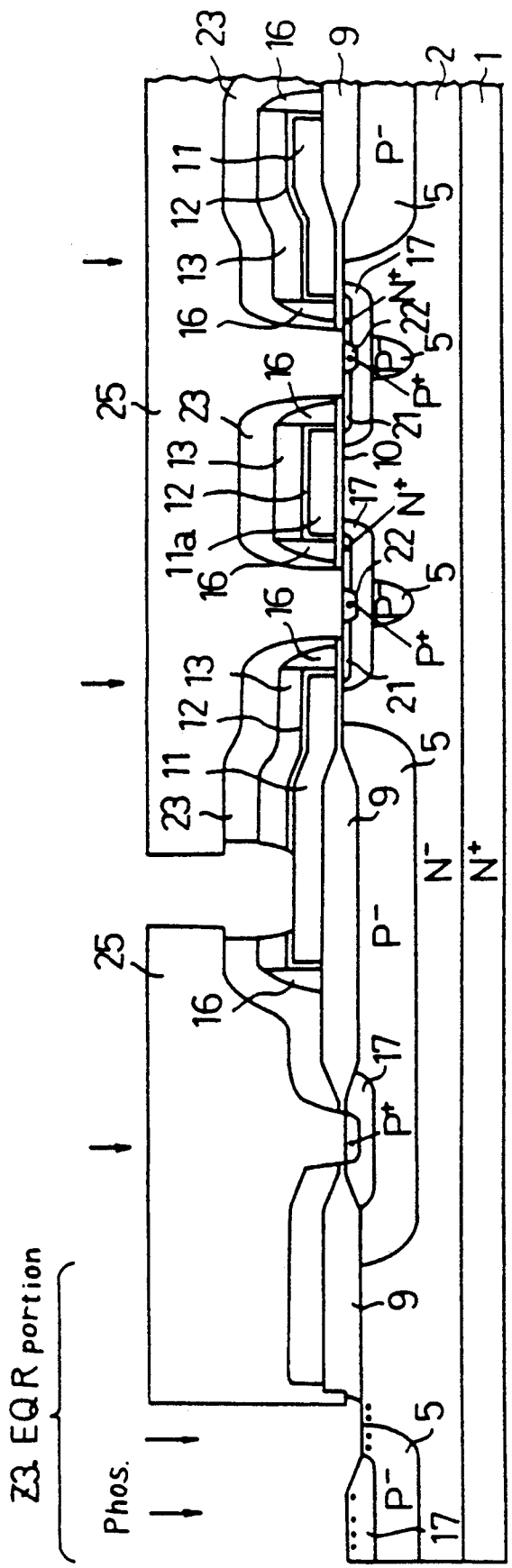
Figure 16:
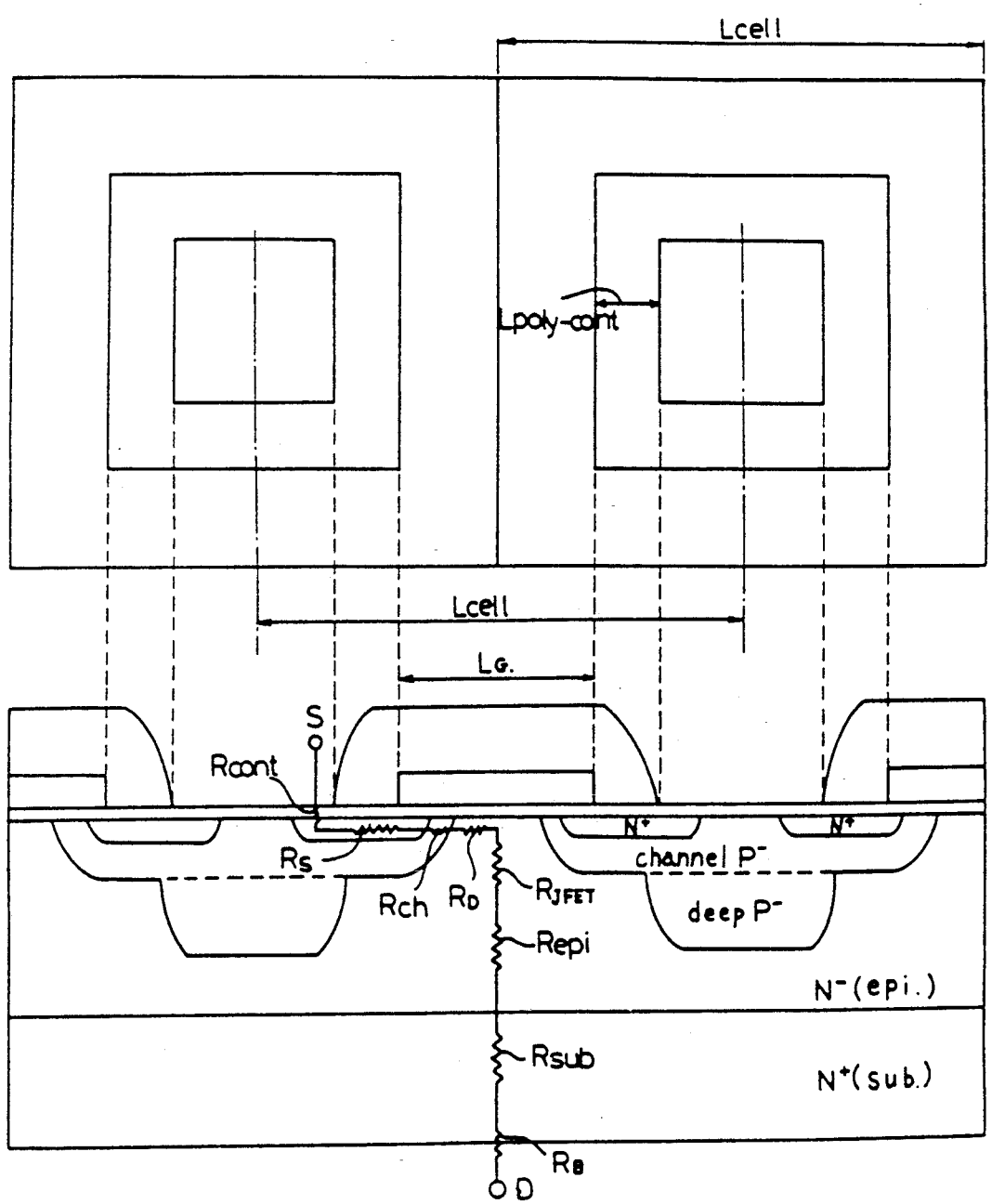
FIGS. 16 and 17 are diagrams showing a semiconductor device.

In succession thereto, as shown in FIG. 15, photoetching using a resist 25 is performed to obtain a contact with the phosphor doped polysilicon film 11. At this time, a hole is simultaneously made in the peripheral portion (EQR portion) Z3.

The reason why the photoetching for the contact in the DMOS transistor portion Z1 (shown in FIG. 14) and the photoetching for the contact with the phosphor doped polysilicon film 11 (shown in FIG. 15) are performed separately is that the etching conditions are much different. Namely, when it is attempted to form the mask member 16 having the width $L_m$ around 1 μm, it is required that the piled film of the phosphor doped polysilicon film 11, polysilicon oxide film 12, and silicon oxide film 13 has the film thickness H around 1.5 μm as shown in FIG. 10, and therefore the contact to the phosphor doped polysilicon film 11 becomes thicker than the contact portion in the DMOS transistor portion Z1 by the thickness of the insulating film (the polysilicon oxide film 12 and silicon oxide film 13).

Then, in FIG. 15, phosphor ion implantation for forming an N+ contact in the peripheral portion (EQR portion) Z3 is performed under the same conditions as in the formation of the N+ source region 21 and then annealing is performed, whereby the N+ layer 26 as shown in FIG. 1 is formed. Thereafter, the aluminum electrode 27, a passivation film (not shown), and the drain electrode 28 on the back face are formed.

Through the described process, a semiconductor device with integrated vertical type DMOS power transistors is completed.

In the semiconductor device produced as described above, the polysilicon gate electrode member 11a with a specified width is disposed on the epitaxial layer 2 as the semiconductor substrate through the gate oxide film 10 as the insulating film, the insulating mask members 16 having a specified width are formed on both sides of the electrode member 11a, the P− channel regions 17 as the first impurity region are formed below the polysilicon gate electrode member 11a within the epitaxial layer 2 by boron ion implantation with the electrode member 11a and the mask members 16 used as the mask, and the N+ source regions 21 as the second impurity region are formed below the polysilicon gate electrode member 11a within the P− channel region 17, but in a shallower position and in a narrower range than the region 17, by phosphor ion implantation with the electrode member 11a and the mask members 16 used as the mask.

In short, the polysilicon gate electrode member 11a with a specified width is disposed on the epitaxial layer 2 as the semiconductor substrate with the gate oxide film 10 as the insulating film interposed therebetween, the P− channel regions 17 as the first impurity region are formed below the polysilicon gate electrode member 11a within the epitaxial layer 2, the N+ source regions 21 as the second impurity region are formed below the polysilicon gate electrode member 11a within the P− channel region 17, but in shallower position and in the narrower range than the region 17, and, further, the insulating mask members 16 having the thickness 0.85 time as large as the depth of the N+ source region 21 are disposed on both sides of the polysilicon gate electrode member 11a.

Now, the design concept in designing the present miniaturized semiconductor device will be described.

In order to secure specifications (source-drain withstand voltage, sheet resistance of impurity regions) of the transistor and also to realize lowered ON resistance therein, following simulation is carried out.

As the ON resistance $R_{on}$, the normalized ON resistance $R_n$ which is normalized by the resistance per 1 mm$^2$ is used. $R_n$ is expressed as $$R_n = \gamma/W_0. \tag{6}$$

where $W_0$ represents the perimeters of the channel regions per 1 mm$^2$ and $\gamma$ represents the resistance per unit length.

Figure 17:
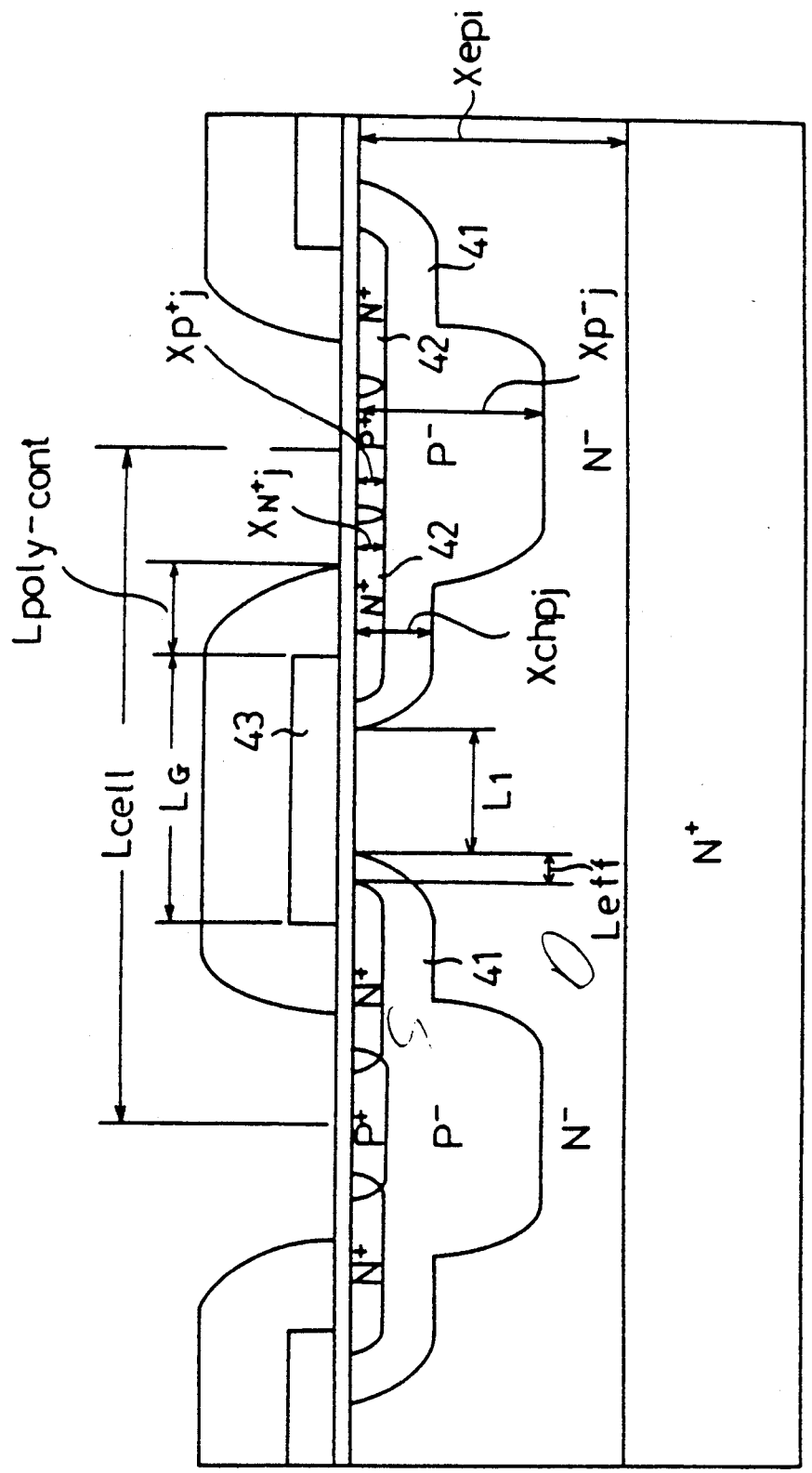

Now, we consider to secure the withstand voltage. For simplicity, we assume here that the diffusion depths $X_{chpj}$, $X_{p-j}$, $X_{P+j}$ of the impurities, and the epitaxial layer thickness $X_{epi}$ and epi concentration (specific resistance $\rho$) are all constant and we consider the case where the cell is to be miniaturized, that is, the cell size $L_{cell}$ is to be made smaller. The value $\gamma$ corresponds to the resistance value in FIG. 17 when unit length is taken in the direction perpendicular to the paper and is the sum total of all the resistance values in the expression (1) per unit length.

Since the contact resistance $R_{cont}$ is inversely proportional to its area, the area cannot be reduced, and hence the area is set to be constant (5 μm square). Further, it is assumed that, when the same photo alignment apparatus is used, the distance $L_{poly-cont}$ between the polysilicon gate electrode material 43 and the contact is constant. Accordingly, to reduce the cell size $L_{cell}$, it becomes necessary to reduce the width $L_G$ (hereinafter called "gate line width") of the polysilicon gate electrode member 43. When the gate line width $L_G$ is reduced, the distance (hereinafter called "channel interval") $L_1$ between edges of the P− channel regions 41 under the polysilicon gate electrode member 43 becomes smaller.

Figure 18:
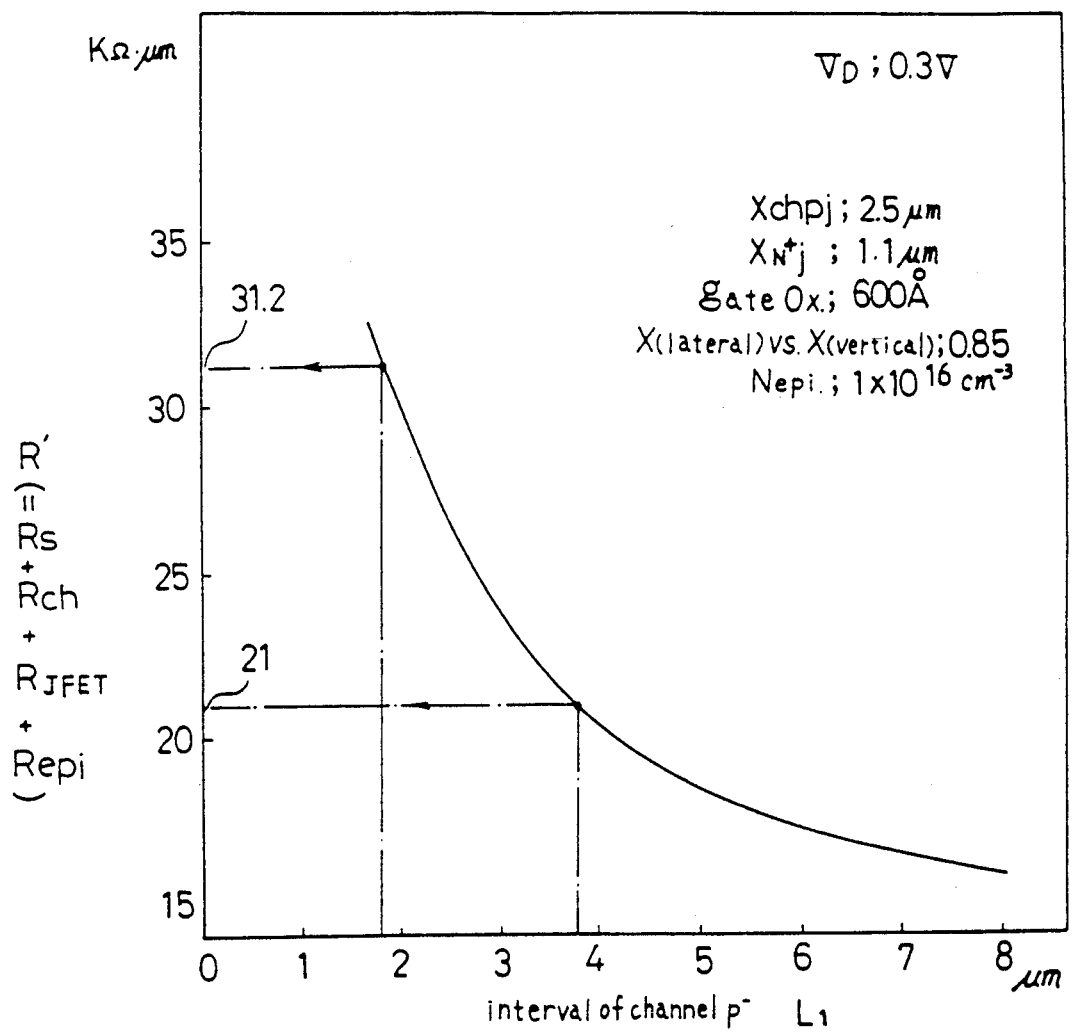
FIG. 18 is a graph showing the relationship between channel interval and resistance.

FIG. 18 shows results of two-dimensional simulation for the channel interval $L_1$ and the resistance value $R'$ ($=R_s+R_{ch}+R_{JFET}+R_{epi}$). From FIG. 18, it is known that $R'$ sharply increases unless the channel interval $L_1$ larger than around 3.5 μm is secured. More specifically, when the cell size $L_{cell}$ (gate line width $L_G$) is reduced, the channel interval $L_1$ is reduced accordingly, which leads to a sharp increase in the resistance $R'$ ($R_{JFET}$). Accordingly, in achieving lowered ON resistance, it becomes necessary to devise miniaturization of the cell while securing the channel interval $L_1$ larger than a specified value (for example 3.8 μm).

For achieving lowered ON resistance, three methods can be considered from the expression (6), that is:

(1) to increase the perimeter $W_o$ of the channel region and also to reduce the resistance $\gamma$ per unit length:
(2) to reduce the resistance $\gamma$ while keeping the perimeter $W_o$ as its is; and
(3) to increase the perimeter $W_o$ while keeping the resistance $\gamma$ as it is.

The method (3) is most effective of the three methods. That is, perimeter $W_o$ is increased while suppressing increase in the resistance $\gamma$ as much as possible even if the cell size is reduced.

Figure 19:
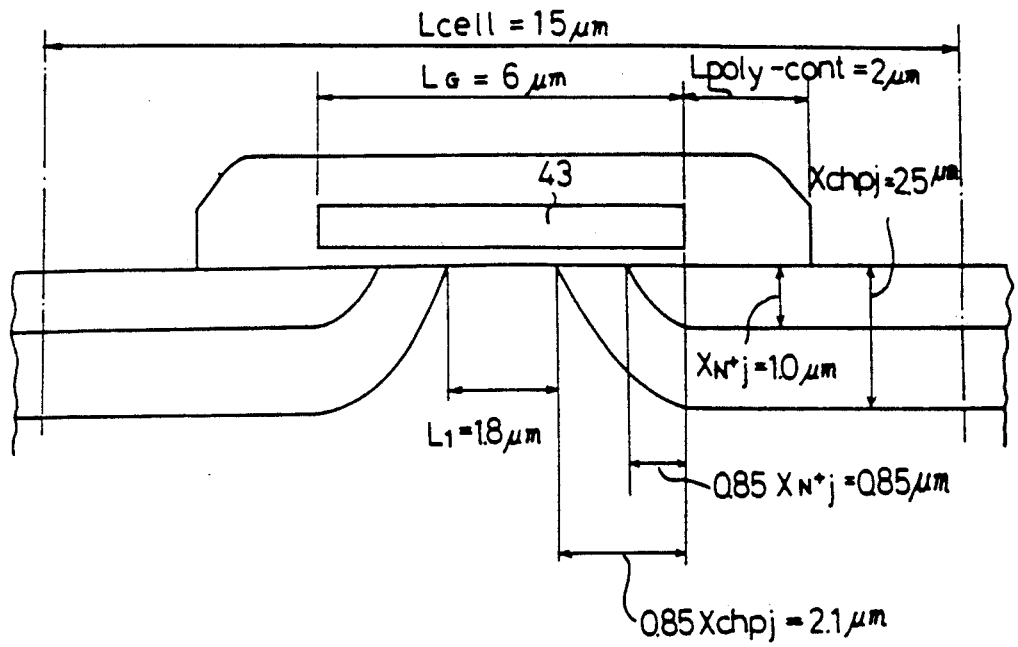
FIGS. 19 and 20 are diagrams showing a semiconductor device.
Figure 20:
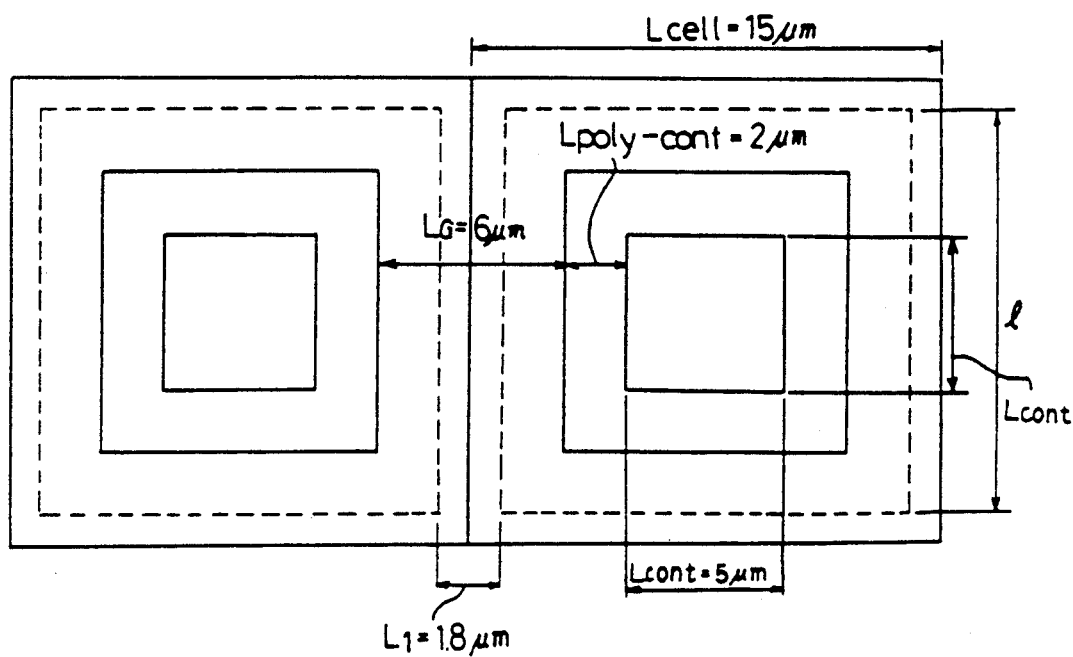

When, as shown in FIGS. 19 and 20, the distance $L_{poly-cont}$ between the polysilicon gate electrode member 43 and the contact is set to 2 μm, the size of the contact is set to 5 μm square, and the gate line width $L_G$ is set to 6 μm, the cell size $L_{cell}$ becomes 15 μm. Further, it is set so that $X_{N+j}=1.0$ μm, $X_{chpj}=2.5$ μm, and lateral diffusion = vertical diffusion depth × 0.85.

In FIG. 19, the channel interval $L_1$ becomes 1.8 μm due to diffusion from the edges of the polysilicon gate electrode member 43, and hence, the resistance value $R'$ ($R_{JFET}$) becomes 31.2 kΩ·μm according to the result of simulation in FIG. 18. As a result, the resistance value becomes approximately 1.5 times (=31.2/21) as large as that when $L_1$ is 3.8 μm (refer to FIG. 18).

Figure 21:
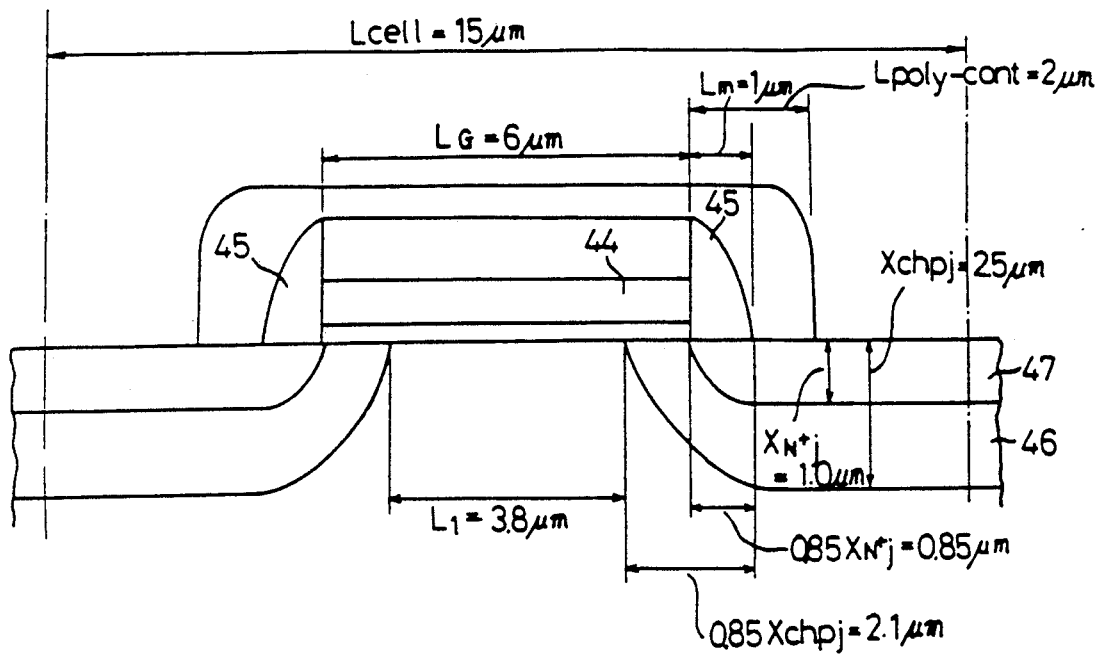
FIGS. 21 and 22 are diagrams showing a semiconductor device.
Figure 22:
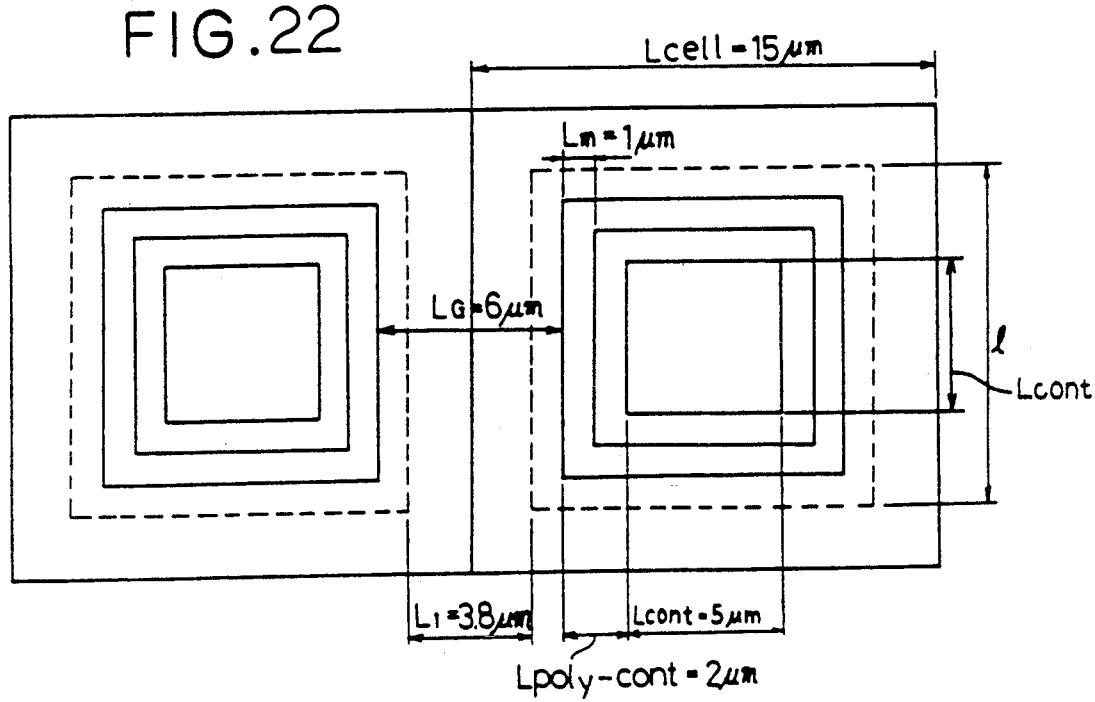

Accordingly, as shown in the device of the present embodiment in FIGS. 21 and 22, insulating mask members 45 with a specified width are formed on both sides of the polysilicon gate electrode member 44, and the P− channel region 46 and N+ source region 47 are formed by ion implantation using the electrode member 44 and the mask member 45 as the mask.

By so doing, the impurity is allowed to diffuse from the mask member 45 and, hence, a specified length (3.8 μm) of the channel interval $L_1$ can be secured even if the line width $L_G$ of the polysilicon gate electrode member 44 is reduced.

In other words, when the mask member 45 is used, the insulating mask member 45 serves as a part of insulting member between the gate and the contact, and hence the line width $L_G$ of the polysilicon gate electrode member 44, with the cell size and the distance $L_{poly-cont}$ between the gate electrode member 44 and the contact kept unchanged, can be prolonged by the length corresponding to twice the width of the mask member (2·$L_m$).

That is, even if the width $L_G$ is reduced, the line width $L_G$ in substance becomes $L_G+2L_m$, and therefore the resistance value $R'$ ($R_{JFET}$) in FIG. 18 is prevented from increasing. Since the length $W_0$ can be increased while the device is miniaturized, lowered ON resistance can be achieved.

Figure 23:
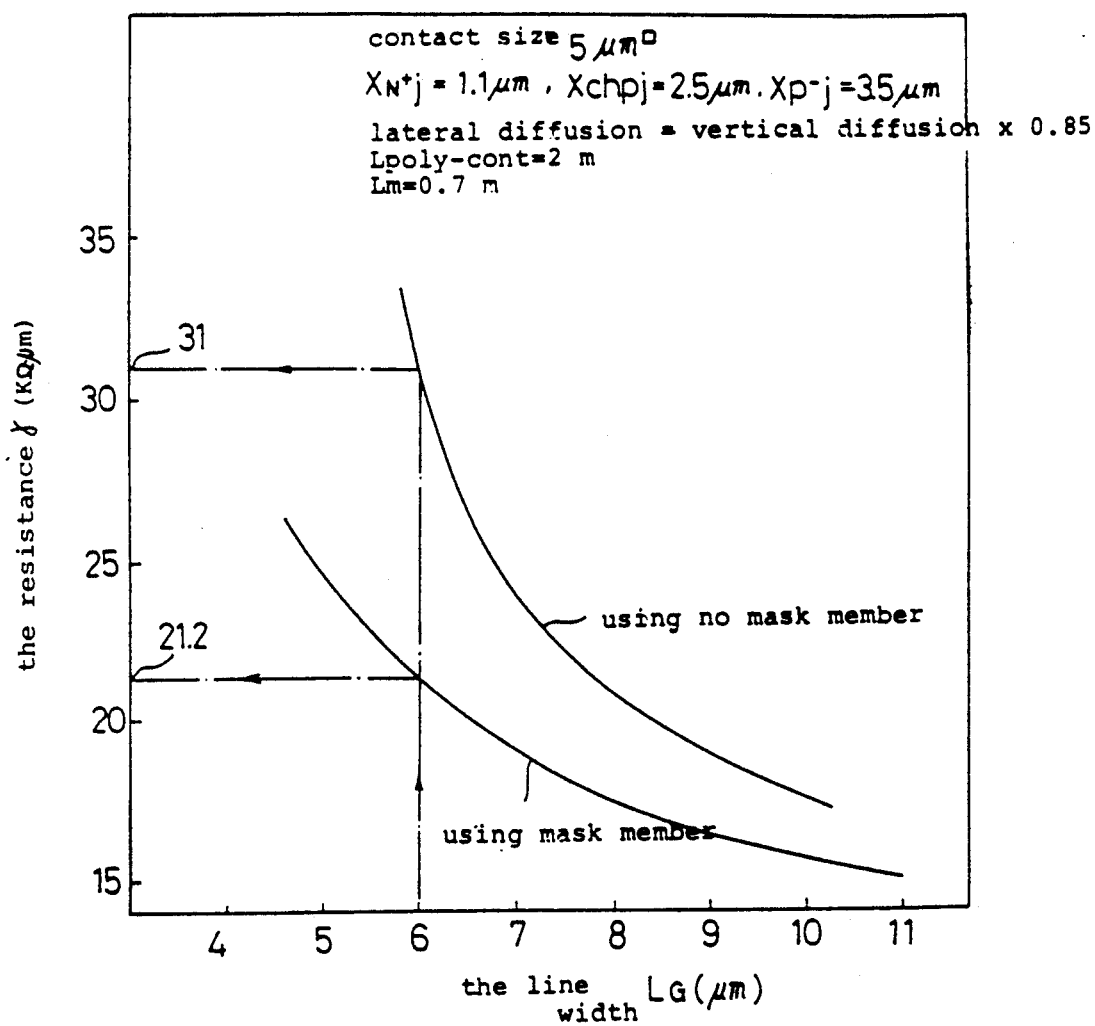
FIG. 23 is a graph showing the relationship between gate line width and resistance.

FIG. 23 shows relationships between the line width $L_G$ of the gate electrode member and the resistance $\gamma$ per unit length in the case where the mask member is used and the case where it is not used. In the present case, conditions are set so that the size of the contact = 5 μm square, $X_{N+j}=1.1$ μm, $X_{chpj}=2.5$ μm, $X_{p-j}=3.5$ μm, lateral diffusion = vertical diffusion × 0.85, the distance $L_{poly-cont}$ between the gate electrode member and the contact = 2 μm, and the width $L_m$ of the mask member = 0.7 μm.

Below will be given description of the perimeter $W_o$ per 1 mm².

If, as shown in FIG. 20, the contact width is represented by $L_{cont}$ and the distance between the gate electrode member and the contact by $L_{poly-cont}$, and lateral diffusion = vertical diffusion × 0.85, then the perimeter 4l of the channel region for one cell (l is the length of one side of the channel region in a square form measured at the edge of the lateral diffusion) is expressed as $$4l = 4 \cdot (L_{cont} + 2 \cdot L_{poly-cont} + 2 \cdot 0.85 \cdot X_{N+j}). \quad (7)$$

Hence, the perimeter $W_o$ per 1 mm² is expressed as $$W_o = 4l \quad (8)$$
$$= \frac{1 \times 1}{L_{cell}^2 \times 10^{-6}} \times 4 \times$$
$$(L_{cont} + 2 \cdot L_{poly-cont} + 2 \cdot 0.85 \cdot X_{N+j}),$$

In concrete terms, if it is set so that $L_{cont}=5$ μm, $L_{poly-cont}=2$ μm, and $X_{N+j}=1.1$ μm, then, since $L_{cell}=L_G+L_{cont}+2\cdot L_{poly-cont}$, the expression (8) becomes $$W_o = \frac{43.4}{(L_G+9)^2 \times 10^{-6}}. \quad (9)$$

Figure 24:
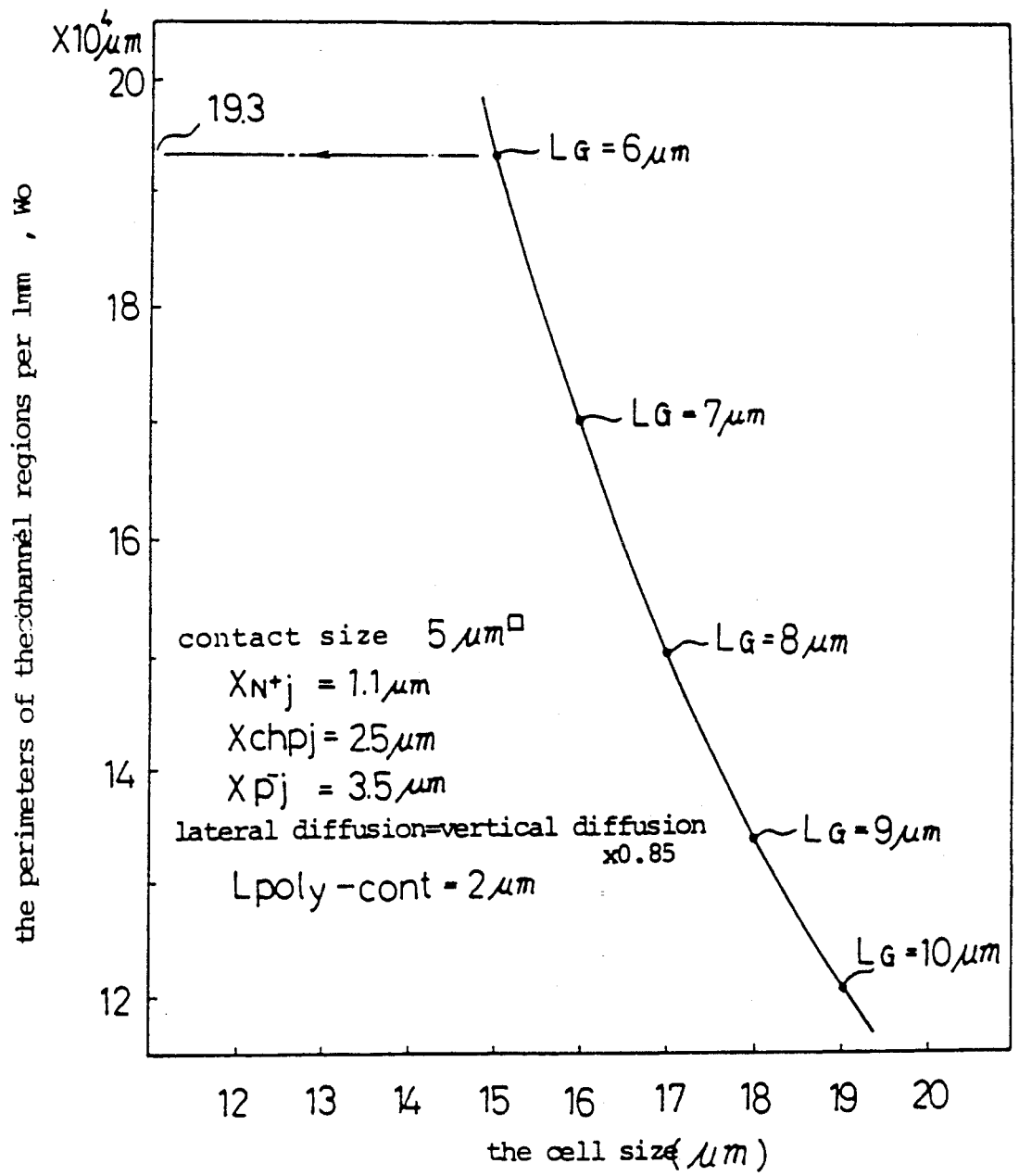
FIGS. 24 and 25 are graphs showing the relationship between cell size and channel perimeter.

Based on the expression (9), the relationship between the cell size $L_{cell}$ and the perimeter $W_o$ for 1 mm² when the mask member is not used is shown in FIG. 24.

When the mask member is used, representing the width of the mask member by $L_m$ as shown in FIG. 22, we obtain $$4l = 4 \cdot (L_{cell} - L_G - 2 \cdot L_m + 2 \cdot 0.85 \cdot X_{N+j}). \quad (10)$$

Using the relationship $L_{cell}=L_G+L_{cont}+2\cdot L_{poly-cont}$, assuming $L_m=0.7$ μm, and substituting values for other parameters used in the expression (9), we obtain $$W_o = 4l \quad (11)$$
$$= \frac{1 \times 1}{L_{cell}^2 \times 10^{-6}} \times 4 \times$$
$$(L_{cell} - L_G - 2 \cdot L_m + 2 \cdot 0.85 \cdot X_{N+j}),$$

and, as the perimeter $W_o$ for 1 mm², we obtain $$W_o = \frac{37.88}{(L_G+9)^2 \times 10^{-6}}. \quad (12)$$

Figure 25:
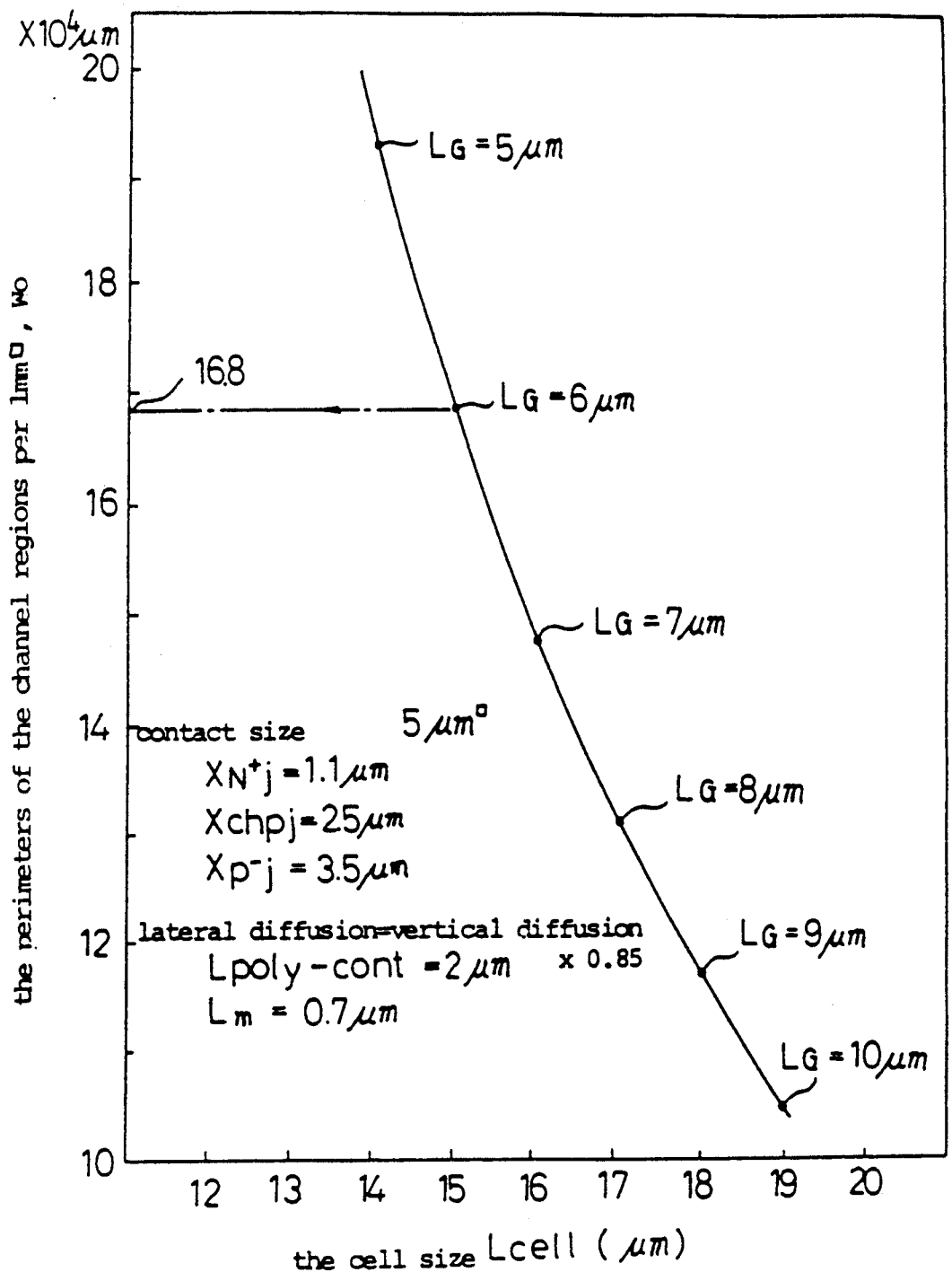

The expression (12) is shown in a graph of FIG. 25. When $W_o$ in FIG. 24 and that in FIG. 25 at $L_G=6$ μm, for example, are compared, while $W_o$ is $19.3 \times 10^4$ μm·mm² when no mask member is used (FIG. 24), $W_o$ when the mask is used (FIG. 25) becomes $16.8\times10^4\mu m\cdot mm^2$, i.e., 13% (=16.8/19.3) smaller. However, as shown in FIG. 23, while $\gamma$ is 31 k$\Omega\cdot\mu$m when no mask member is used, $\gamma$ when the mask member is used becomes 21.2 k$\Omega\cdot\mu$m. Therefore, it is advantageous to use the mask member.

More specifically, since $R_n=\gamma/W_o$ from the expression (6), $R_n$ when no mask is used becomes $$R_n = \frac{31}{19.3 \times 10^4} = 160 \text{ m}\Omega \cdot mm^2,$$

whereas $R_n$ when the mask member is used becomes $$R_n = \frac{-21.2}{16.8 \times 10^4} = 126 \text{ m}\Omega \cdot mm^2,$$

and thus use of the mask member contributes to achievement of lowered ON resistance.

Figure 26:
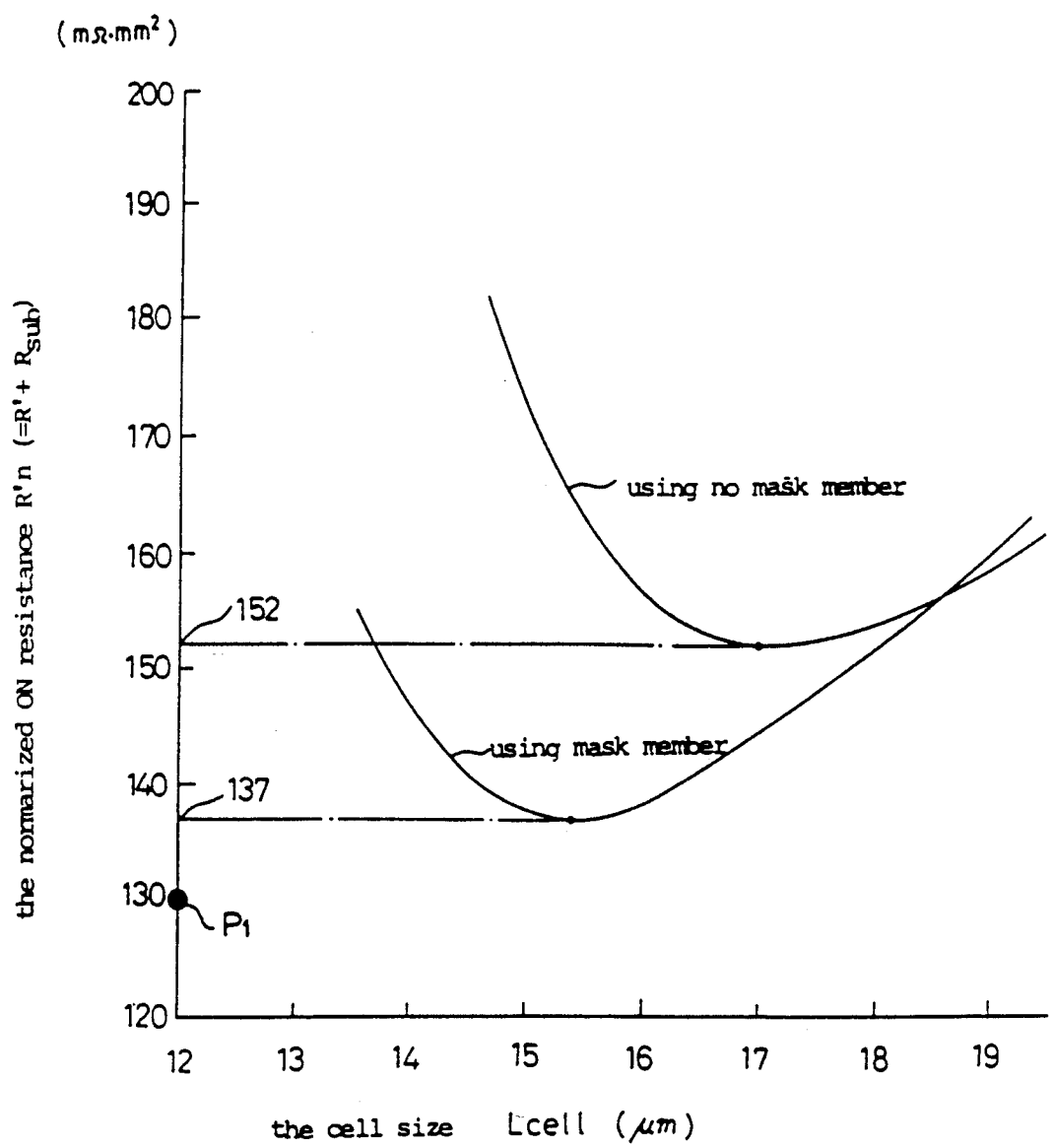
FIG. 26 is a graph showing the relationship between cell size and resistance.

Finally, results as shown in FIG. 26 are obtained. Referring to FIG. 26, the axis of ordinates represents $R_n'$ ($R_n+12$ m$\Omega\cdot mm^2$) when $R_{sub}=12$ m$\Omega\cdot mm^2$ and the axis of abscissas represents the cell size $L_{cell}$. Parameters are of the same values as shown in FIGS. 23, 24, and 25. It is apparent from this graph that $R_n$, when mask members are used, can be reduced by 10% (=137/152) as compared with the case where no mask member is used, while reducing the cell size.

In the present embodiment as described above, double diffusion of impurities is performed with the polysilicon gate electrode member 11a and the mask members 16 disposed on both sides of the electrode member 11a used as the mask, and thereby, the distance between the edges of the P− channel regions 17 (channel interval $L_1$) below the electrode member 11a can be made larger by the length corresponding to the mask members, without changing parameters such as the diffusion depth of the impurity. In other words, it becomes possible to reduce the cell size with the distance $L_1$ between the edges of the P− channel regions 17 kept constant. Therefore, lowering of the ON resistance and miniaturization of the cell can be achieved while maintaining the transistor specifications (such as source-drain withstand voltage and sheet resistance of impurity regions).

Second Embodiment

Second embodiment will now be described. In the present embodiment, only points different from the first embodiment will be described. Other points are the same as in the first embodiment.

Figure 27:
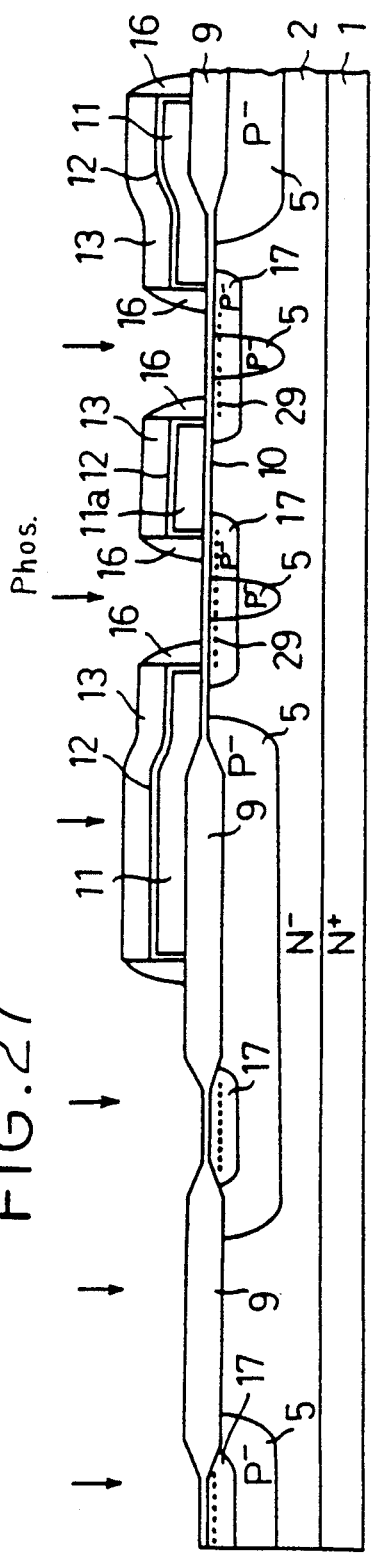
FIGS. 27 to 29 are diagrams showing the production process of a semiconductor device of a second embodiment.
Figure 28:
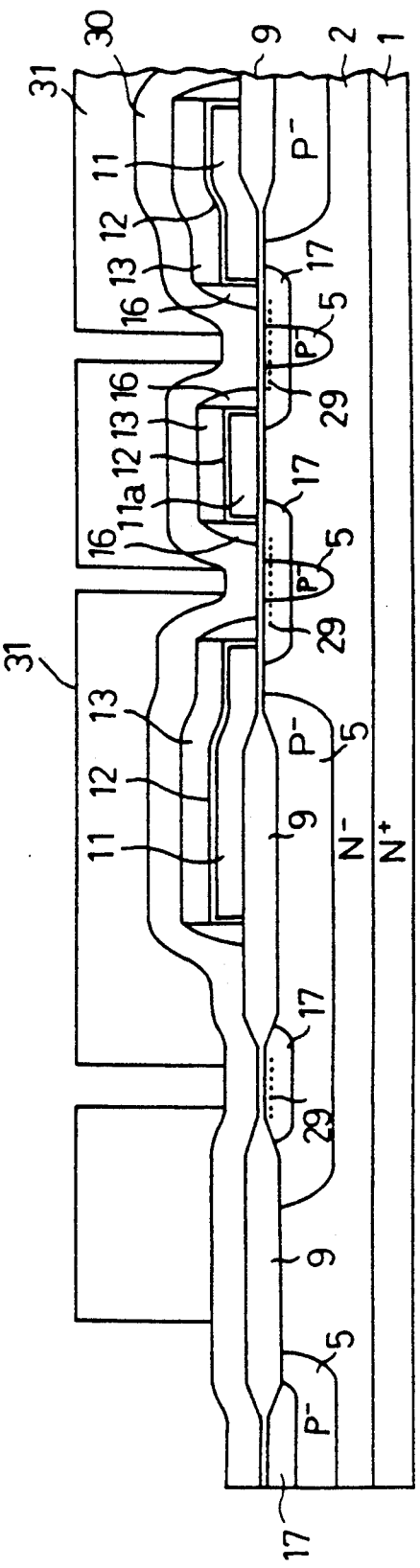
Figure 29:
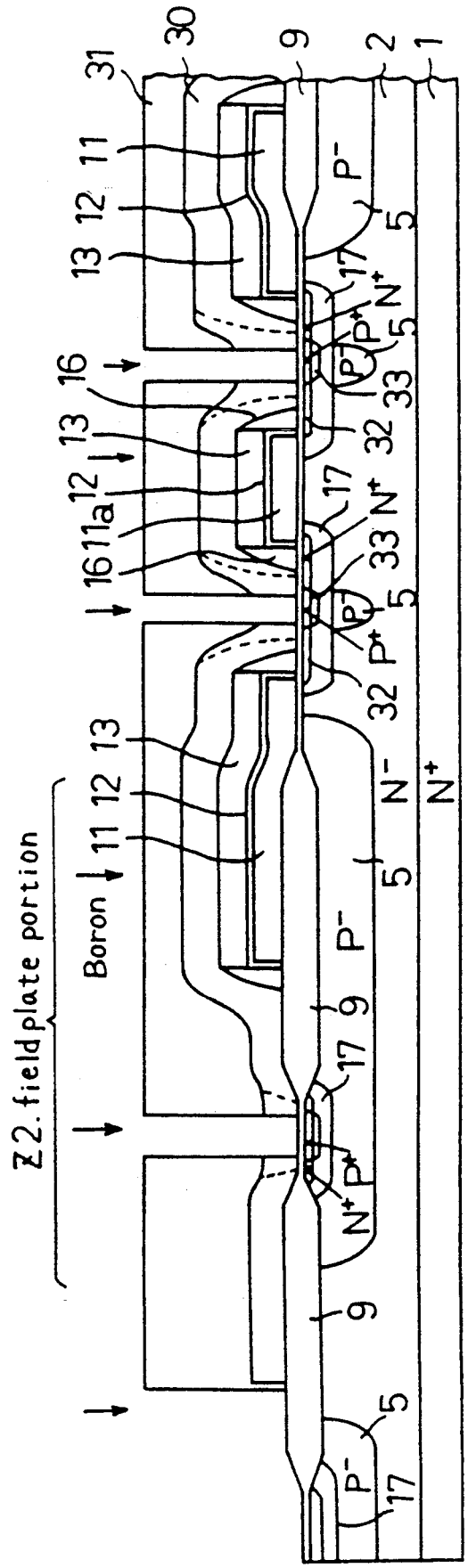

Following the state shown in FIG. 11 in the first embodiment, as shown in FIG. 27, phosphor ions for forming N+ source regions are implanted into the entire surface (maskless), whereby N+ implanted regions 29 are formed. Next, as shown in FIG. 28, a BPSG film 30 is formed on the entire surface, and thereafter, as shown in FIG. 29, photoetching for forming P+ body contacts is performed using a resist 31.

Then, boron ions are implanted into the N+ source region 32 to thereby form a P+ contact region 33. In this ion implantation, a high dose sufficient to invert the N+ source region 32, $1\times10^{16}cm^{-2}$ dose for example, is given at 60 keV. At this time, since the contact portion of the field plate portion Z2 is also inverted to P+ layer, the contact with the P− channel region 17 can be obtained. Thereafter, with the resist 31 remaining attached to the product, wet etching is performed with HF or the like. As a result, the form as indicated by the broken lines in FIG. 29 is obtained by side etching and, thereby, it becomes possible to form a contact shorting the N+ source region 32 and the P+ contact region 33.

The process to be performed thereafter is the same as that shown in FIGS. 15 and 1.

According to the present embodiment, as compared with the first embodiment, one photomask can be saved by using the resist 31 as both the mask member for making hole and the mask member for ion implantation.

Third Embodiment

Third embodiment will now be described. Also in the present embodiment, only points different from the first embodiment will be described. Other points are the same as in the first embodiment.

Figure 30:
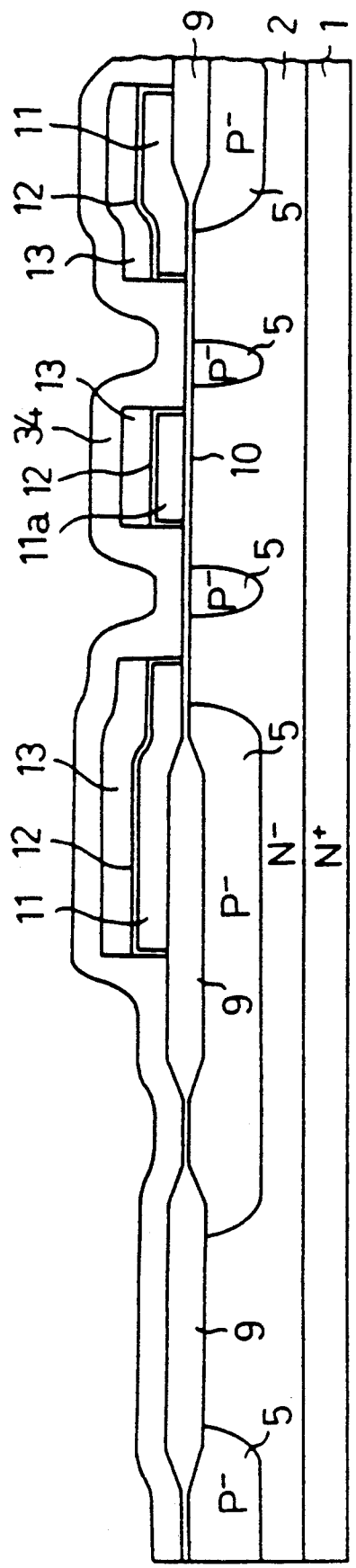
FIGS. 30 to 32 are diagrams showing the production process of a semiconductor device of a third embodiment.
Figure 31:
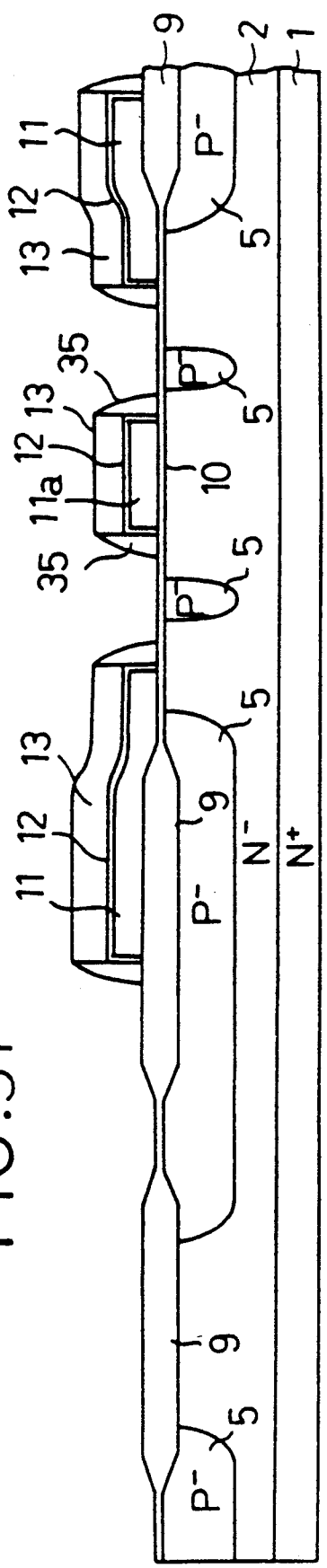

Although the CVD silicon oxide film 15 of TEOS was used as a film having a good step covering characteristic in the first embodiment, a low stress silicon nitride film 34 is used in the third embodiment as shown in FIG. 30. Thereafter, as shown in FIG. 31, the mask member 35 is formed of the silicon nitride film 34 by applying an etchback treatment thereto.

Figure 32:
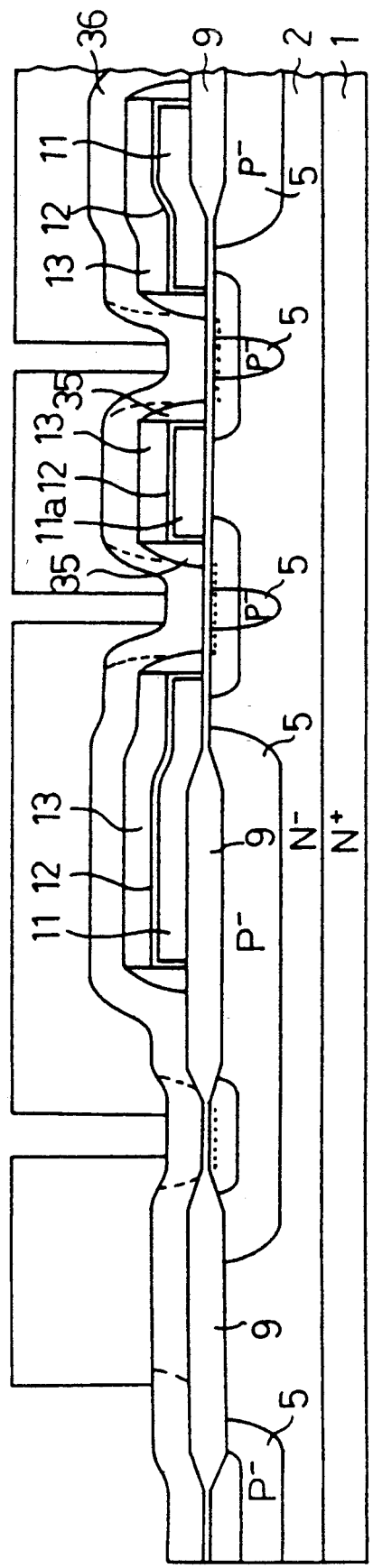

The mask member 16 had to be covered by the BPSG film in the first embodiment to secure insulation between the polysilicon gate electrode member 11a and the aluminum electrode 27 because the mask member 16 (the CVD silicon oxide film 15) and the BPSG film 23 are films of the same $SiO_2$ type and therefore exhibit virtually the same etch rate when subjected to wet etching with HF or the like. However, by the use of the mask member 35 of the silicon nitride film 34 in the present embodiment, its etching rate by wet etching with HF or the like becomes very low. Therefore, even if the BPSG film 36, during the etching for the contact, should get overetched as shown by broken lines in FIG. 32, the etching process would selectively stop at the mask member 35. Accordingly, reduction in the cell size $L_{cell}$ can be achieved.

More specifically, by bringing the distance $L_{poly\text{-}cont}$ to nil, a 12-$\mu$m cell as shown by the point $P_1$ in FIG. 26 can be produced and, by comparing the minimum values shown in the graph, the resistance $R_n$ can be reduced by 15% (=130/152).

The present invention is not limited to the above described embodiments but is applicable, for example, to P-channel MOS transistors, and not only to MOS transistors but also to IGBTS, SITS, SI thyristors, etc. The formation of the mask member in the above described embodiments was performed by forming the silicon oxide film 15 on the entire surface of the substrate and then applying an etchback treatment to the film. However, it may be practicable to first deposit a silicon oxide film 15 to the entire surface of the substrate including the electrode members and then apply a photoetching treatment to the film using a resist so that a specified width of the film is left deposited on the side of the electrode members.

What is claimed is:

1. A method for producing a vertical semiconductor device comprising the steps of:
   preparing a semiconductor substrate provided with a semiconductor region of a first conduction type on one principal plane;
   forming a gate structure including at least a gate electrode on the surface of said semiconductor region;

forming an insulating mask member having a width on each side of said gate structure;

forming channel regions of a second conduction type, said channel regions formed from opposite sides of said gate structure in a manner self-aligning with said gate structure and said mask member to create PN junctions between said channel regions and said semiconductor region, and so that a distance $L_1$ between edges of said channel regions is longer than a length at which a resistance of a JFET including said channel regions below said gate structure and said semiconductor region begins increasing sharply; and forming a source region of the first conduction type in each of said channel regions in a manner self-aligning with said gate structure and said mask member to create PN junctions between said source regions and said channel regions, each of said channel regions electrically separating a corresponding one of said source regions from said semiconductor region.

2. A method for producing a vertical type semiconductor device according to claim 1, wherein said gate structure forming step includes a step for forming an auxiliary member on said gate electrode in order to control the width of said mask member.

3. A method for producing a vertical type semiconductor device according to claim 1, wherein said mask member forming step comprises a step for depositing an oxide film.

4. A method for producing a vertical type semiconductor device according to claim 1, wherein said mask member forming step comprises a step for depositing a nitride film.

5. A method for producing a vertical semiconductor device according to claim 1, wherein said step of forming said channel regions includes a step of forming said channel regions so that said distance $L_1$ is longer than approximately 3.5 micrometers.

6. A method for producing a vertical semiconductor device according to claim 5, wherein said step of forming said channel regions includes a step of forming said channel regions so that said distance $L_1$ is longer than 3.8 micrometers.

7. A method for producing a vertical semiconductor device according to claim 1, where said gate forming step includes the steps of:

forming a gate electrode on said semiconductor region;

oxidizing exposed surfaces of said gate electrode; and forming an oxide film over said oxidized surface of said gate electrode.

8. A method for producing a vertical semiconductor device according to claim 1, wherein said channel forming step includes the steps of:

forming deep well layers of said second conductivity type on opposite sides of said gate structure; and forming regions of said second conductivity type over said deep well layers and extending more broadly and less deeply than said deep well layers, said deep well layers and said second conductivity type regions forming said channel regions.

9. A method for producing a vertical power semiconductor device having a predetermined breakdown voltage, said method comprising the steps of:

preparing a semiconductor substrate provided with a semiconductor region of a first conduction type on one principal plane;

forming a gate structure including at least a gate electrode on a surface of said semiconductor region;

forming an insulating mask member having a width on each side of said gate structure;

forming channel regions of a second conduction type, said channel regions formed from opposite sides of said gate structure in a manner self-aligning with said gate structure and said mask member to create PN junctions between said channel regions and said semiconductor region, a distance $L_1$ between edges of said channel regions being longer than approximately 3.5 micrometers; and forming a source region of the first conductive type in each of said channel regions in a manner self-aligning with said gate structure and said mask member to create PN junctions between said source regions and said channel regions, each of said channel regions electrically separating a corresponding one of said source regions from said semiconductor region.

* * * * *